(12) United States Patent
Nishimura

(10) Patent No.: US 6,259,288 B1
(45) Date of Patent: *Jul. 10, 2001

(54) SEMICONDUCTOR INTEGRATED CIRCUIT HAVING A DLL CIRCUIT AND A SPECIAL POWER SUPPLY CIRCUIT FOR THE DLL CIRCUIT

(75) Inventor: Koichi Nishimura, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/845,923

(22) Filed: Apr. 28, 1997

(30) Foreign Application Priority Data

Dec. 13, 1996 (JP) .................................................. 8-334209

(51) Int. Cl.$^7$ ...................................................... H03L 7/06
(52) U.S. Cl. ............................ 327/156; 327/158; 327/159
(58) Field of Search ................................... 327/147, 149, 327/150, 153, 156, 158, 159, 161, 530, 270, 271, 273, 276, 277, 279

(56) References Cited

U.S. PATENT DOCUMENTS

| | | | |
|---|---|---|---|
| 3,961,282 | * 6/1976 | Chen et al. ......................... | 331/1 R |
| 4,338,569 | * 7/1982 | Petrich ............................... | 327/158 |
| 4,922,141 | * 5/1990 | Lofgren et al. ..................... | 327/244 |
| 5,049,766 | * 9/1991 | Van Driest et al. ................. | 327/269 |
| 5,087,829 | * 2/1992 | Ishibashi et al. ................... | 327/158 |
| 5,117,205 | * 5/1992 | Nauta ............................ | 331/117 FE |
| 5,124,796 | * 6/1992 | Maki ................................. | 327/284 |
| 5,218,244 | * 6/1993 | Nokubo ............................... | 326/67 |
| 5,223,755 | * 6/1993 | Richley .............................. | 327/158 |
| 5,440,515 | * 8/1995 | Chang et al. ....................... | 365/194 |
| 5,610,543 | * 3/1997 | Chang et al. ....................... | 327/158 |
| 5,619,166 | * 4/1997 | Gross ................................. | 327/552 |
| 5,642,082 | * 6/1997 | Jefferson ............................ | 331/25 |
| 5,684,421 | * 11/1997 | Chapman et al. ................... | 327/261 |
| 5,686,868 | * 11/1997 | Hasegawa et al. .................. | 331/75 |
| 5,687,202 | * 11/1997 | Eitrheim ............................ | 375/376 |
| 5,731,735 | * 3/1998 | Yokota et al. ..................... | 327/535 |
| 5,764,092 | * 6/1998 | Wada et al. ........................ | 327/271 |
| 5,796,673 | * 8/1998 | Foss et al. ......................... | 365/233 |
| 5,990,715 | * 11/1999 | Nishimura ......................... | 327/158 |

* cited by examiner

Primary Examiner—Timothy P. Callahan
Assistant Examiner—An Luu
(74) Attorney, Agent, or Firm—Arent Fox Kintnerr Plotkin & Kahn, PLLC

(57) ABSTRACT

A semiconductor integrated circuit has a DLL circuit for receiving a first control signal and generating a second control signal synchronized with the first control signal by carrying out a phase synchronization process. The semiconductor integrated circuit has a power supply circuit. The power supply circuit keeps the power supply voltage at a specific voltage level and supplies the power supply voltage only to the DLL circuit. Therefore, the DLL circuit can generate an internal clock which is stable and accurately synchronized with an external clock without including jitter.

22 Claims, 21 Drawing Sheets

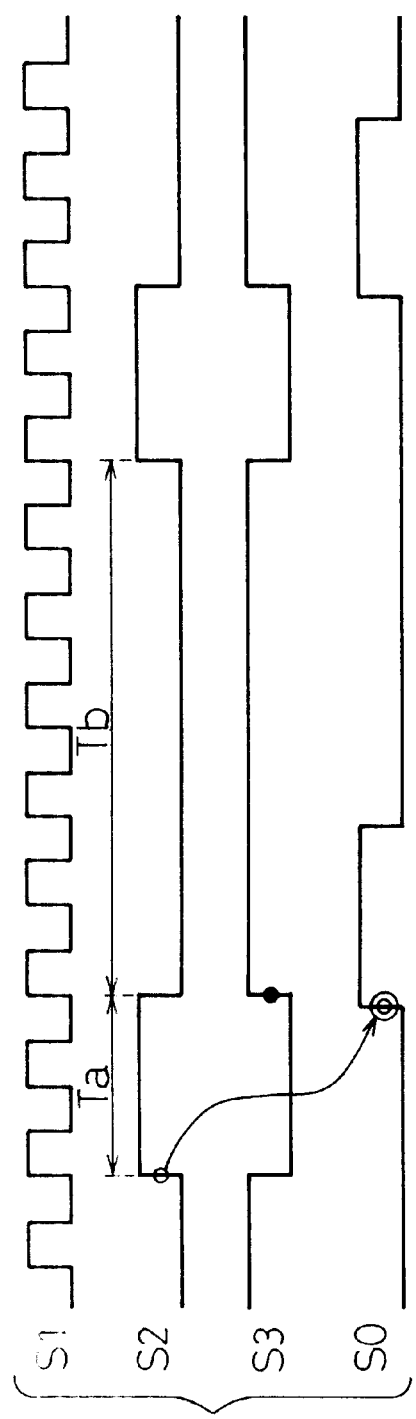

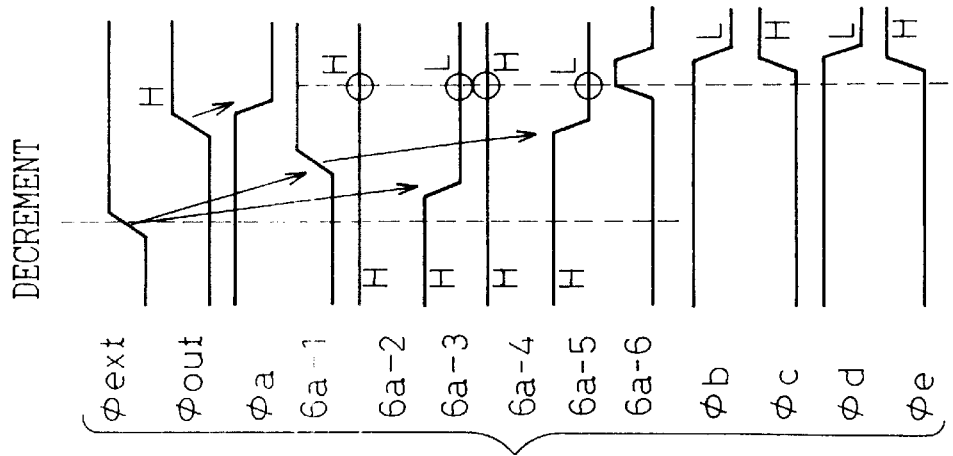
Fig.11A INCREMENT
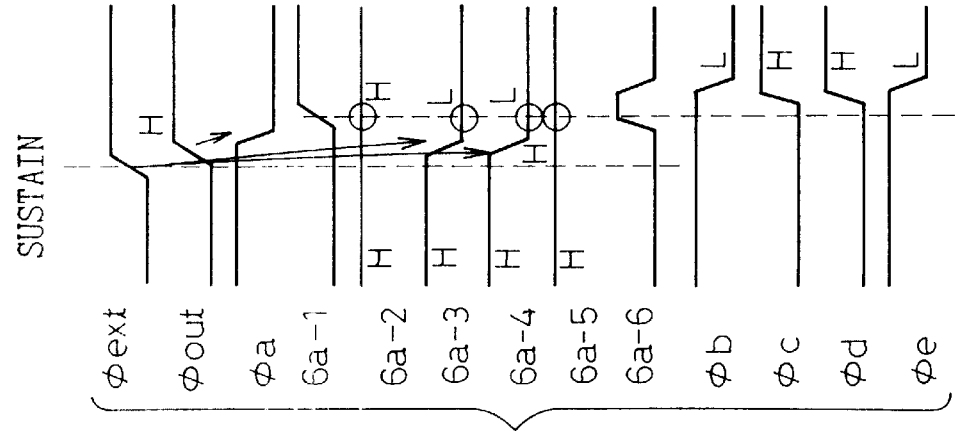
Fig.11B SUSTAIN
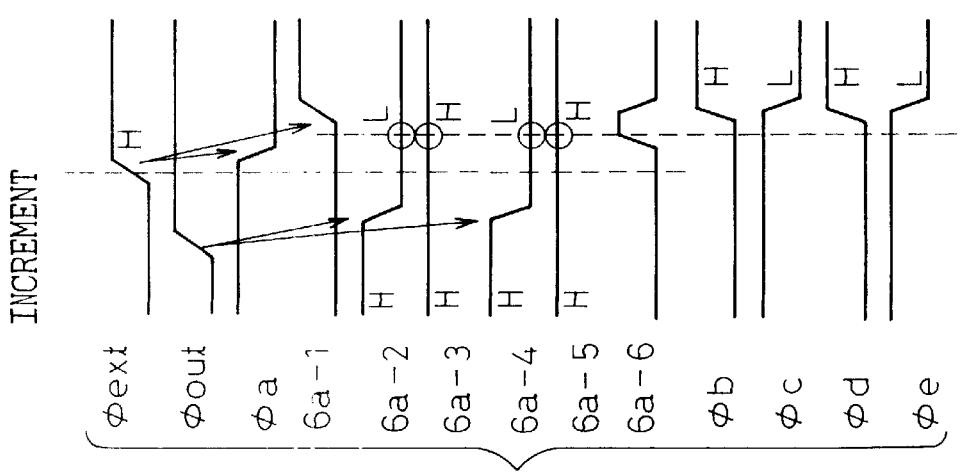
Fig.11C DECREMENT

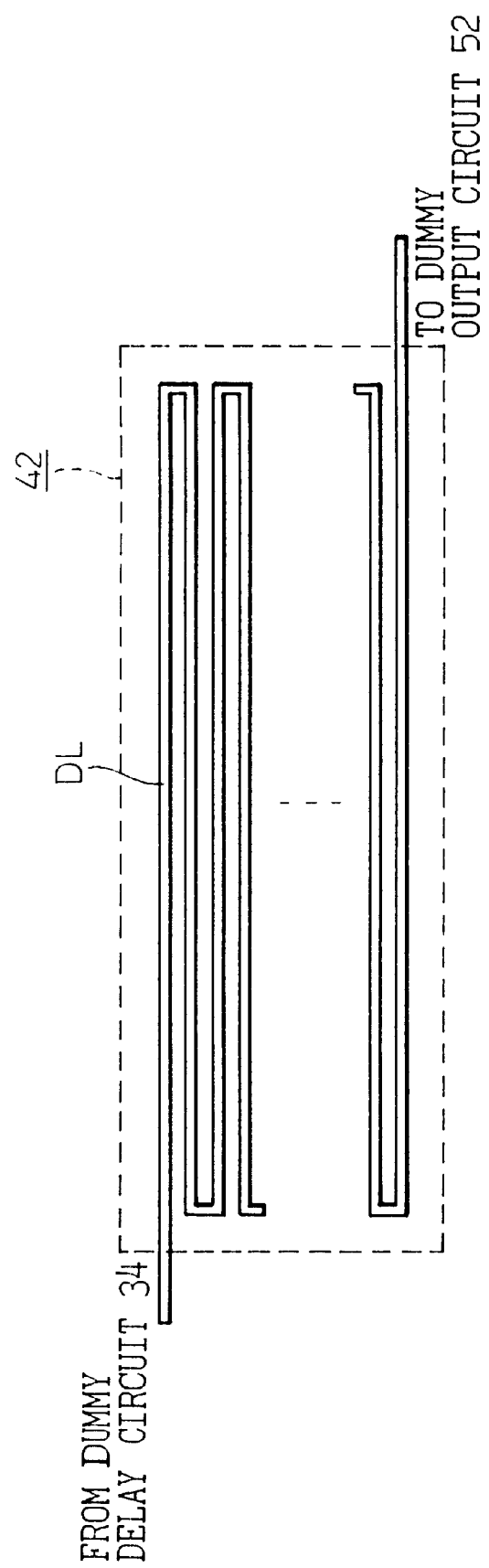

SEMICONDUCTOR INTEGRATED CIRCUIT HAVING A DLL CIRCUIT AND A SPECIAL POWER SUPPLY CIRCUIT FOR THE DLL CIRCUIT

BACKGROUND OF THE INVENTION

1. Field of the Invention

The present invention relates to a semiconductor integrated circuit, and more particularly, to a semiconductor integrated circuit having a DLL (Delay Locked Loop) circuit and a special power supply circuit for the DLL circuit.

2. Description of the Related Art

Recently, an operation speed of a semiconductor integrated circuit has been increased, and a circuit scale thereof has become large. Further, it has been necessary to supply a synchronized signal (phase synchronized clock signal) to a specific circuit in a large scale semiconductor integrated circuit.

For example, an operation speed of a memory device, e.g., a synchronous DRAM (SDRAM), now exceeds 100 MHz, and a DLL circuit must be used to synchronize a signal with an external clock and supply the synchronized signal to a plurality of output buffers, so as to remove a delay of an internal clock. Namely, a phase of the external clock is coincident with that of the internal clock, and thereby a delay or fluctuation of an access time is removed.

Specifically, in a SDRAM, a DLL circuit must be used to synchronize an internal clock with an external clock and supply the synchronized internal clock to a plurality of output buffers, so as to remove a delay of an internal clock. Namely, a phase of the external clock is coincident with that of the internal clock, and thereby a delay or fluctuation of an access time is removed. Further, in accordance with increasing the operation speed of the semiconductor integrated circuit, the internal clock generated by the DLL circuit should have much higher accuracy.

In a semiconductor integrated circuit of a related art, a DLL circuit and peripheral circuits except for the DLL circuit commonly receive the same power supply voltage output from a power supply circuit. Therefore, when the peripheral circuits use a large current from the power supply circuit or when noise is caused in the power supply voltage in an area of the peripheral circuits, the power supply voltage applied to the DLL circuit is lowered or fluctuated by the noise, and the internal clock output from the DLL circuit is not stable and the accuracy (synchronization with the external clock) of the internal clock is decreased. In addition, the internal clock output from the DLL circuit may include a jitter.

The related arts and their associated problems will be described in detail later with reference to the accompanying drawings.

SUMMARY OF THE INVENTION

An object of the present invention is to provide a semiconductor integrated circuit having a DLL circuit which can generate an internal clock being stable and accurately synchronized with an external clock without including a jitter.

According to the present invention, there is provided a semiconductor integrated circuit having a DLL circuit for receiving a first control signal and generating a second control signal synchronized with the first control signal by carrying out a phase synchronization process, comprising a power supply circuit for supplying a power supply voltage only to the DLL circuit.

Further, according to the present invention, there is provided a semiconductor integrated circuit comprising a DLL circuit for receiving a first control signal and generating a second control signal synchronized with the first control signal by carrying out a phase synchronization process; a first power supply circuit for supplying a power supply voltage to the DLL circuit; peripheral circuits except for the DLL circuit; and a second power supply circuit for supplying a power supply voltage to the peripheral circuits.

The first power supply circuit may be a voltage down generator. The voltage down generator may comprise a transistor having a source to which a power supply voltage of the semiconductor integrated circuit is applied, a gate to which a control voltage is applied, and a drain through which an output voltage of the voltage down generator is applied to the DLL circuit. The voltage down generator may further comprise a capacitor for maintaining the control voltage applied to the gate of the transistor.

The DLL circuit may comprise a first delay circuit for receiving the first control signal and supplying the second control signal having a specific delay to an object circuit; a divider circuit for receiving the first control signal; a second delay circuit for receiving a first output signal of the divider circuit; a phase comparator having a first input to which a second output signal of the divider circuit is supplied and a second input to which an output signal of the second delay circuit is supplied through a delay applying unit, for carrying out a comparing process of comparing the phases of the second output signal of the divider circuit and the output signal of the second delay circuit, the delay applying unit applying a delay corresponding to a time determined by transferring an output signal of the first delay circuit from the first delay circuit to the object circuit; and a delay controller for receiving an output signal of the phase comparator and controlling delay values of the first and second delay circuits.

The divider circuit may generate the first and second output signals by X-dividing a frequency of the first control signal, and the comparing process of the phase comparator may be carried out by every X periods of the first control signal, where X denotes an integer number of two or more. The first and second output signals of the divider circuit may be complementary signals. The divider circuit may generate the first signal where Y periods of the first control signal is at a first level and Z periods of the first control signal is at a second level, and the comparing process of the phase comparator may be carried out at a timing of delaying Y periods of the first control signal, where Y denotes an integer number of two or more, and Z denotes an integer number.

The first control signal may be supplied through an input circuit, and the output signal of the second delay circuit may be supplied to the second input of the phase comparator through the dummy line, a dummy object circuit, and a dummy input circuit. A sum of a delay of the input circuit, a minimum delay of the first delay circuit, a delay of the dummy line, and a delay of the object circuit may exceed one period of the first control signal, the comparing process of the phase comparator may be carried out by a timing of delaying two or more periods of the first control signal. The semiconductor integrated circuit may be a synchronous DRAM, and the object circuit may be an output circuit of the synchronous DRAM.

BRIEF DESCRIPTION OF THE DRAWINGS

The present invention will be more clearly understood from the description of the preferred embodiments as set forth below with reference to the accompanying drawings, wherein:

FIG. 6 is a timing chart showing an operation of the semiconductor integrated circuit employing the divider circuit of FIG. 4;

FIGS. 11A, 11B, and 11C are timing charts showing operations of the phase comparator of FIG. 10;

FIG. 21 is a diagram showing an example of a dummy line for transmitting a dummy internal clock signal in a semiconductor integrated circuit according to the present invention.

DESCRIPTION OF THE PREFERRED EMBODIMENTS

For a better understanding of the preferred embodiments of the present invention, a related art and the problem thereof will be explained.

Figure 1:
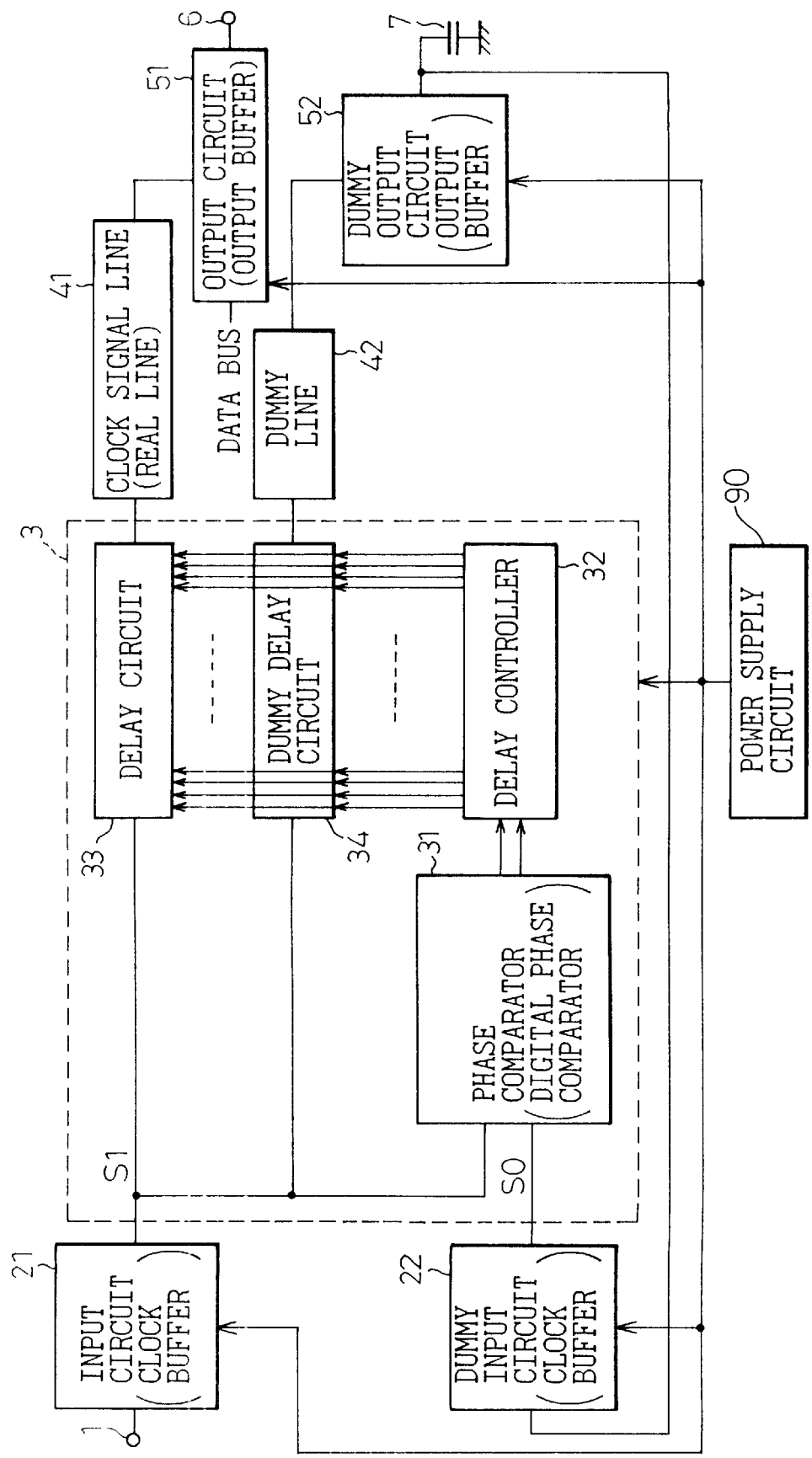
FIG. 1 is a block diagram showing an example of a semiconductor integrated circuit according to the related art.

FIG. 1 shows an example of a semiconductor integrated circuit according to the related art. In FIG. 1, reference numeral 1 denotes a clock input pad, 21 denotes an input circuit (clock buffer), 22 denotes a dummy input circuit (clock buffer), and 3 denotes a DLL circuit. Further, reference numeral 41 denotes a clock signal line (real line), 42 denotes a dummy line, 51 denotes an output circuit (output buffer), 52 denotes a dummy output circuit (output buffer), 6 denotes a data output pad, 7 denotes a dummy load capacitor, 90 denotes a power supply circuit.

As shown in FIG. 1, the DLL circuit 3 comprises a phase comparator (digital phase comparator) 31, a delay controller 32, a delay circuit 33, and a dummy delay circuit 34. An external clock (external input clock signal) CLK is supplied to the phase comparator 31 through the input circuit 2 (with reference to a signal S1), and the external clock CLK is also supplied to the phase comparator 31 through the dummy delay circuit 34, dummy line 42, dummy output circuit 52, and dummy input circuit 22 (with reference to a signal S0). These signals S1 and S0 are compared (phase-compared) by the phase comparator 31, and the delay controller 32 is controlled by output signals of the phase comparator 31. Note that the signal S0 supplied to the phase comparator 31 from the dummy input circuit 22 is a signal of delaying one clock cycle of the external clock CLK by the dummy line 42, and the like. The delayed signal S0 is compared with the signal S1 output from the input circuit 21 by the phase comparator 31.

The delay controller 32 controls the delay circuit 33 and the dummy delay circuit 34 to apply the same delay (delay value) in accordance with output signals (comparison result) of the phase comparator 31. Therefore, the delay (delay time) caused by the input circuit 21, delay circuit 33, real line 41, and output circuit 51 are removed, and the internal clock signal for the output circuit 51 is supplied at the same timing of inputting the external clock CLK.

Figure 17:
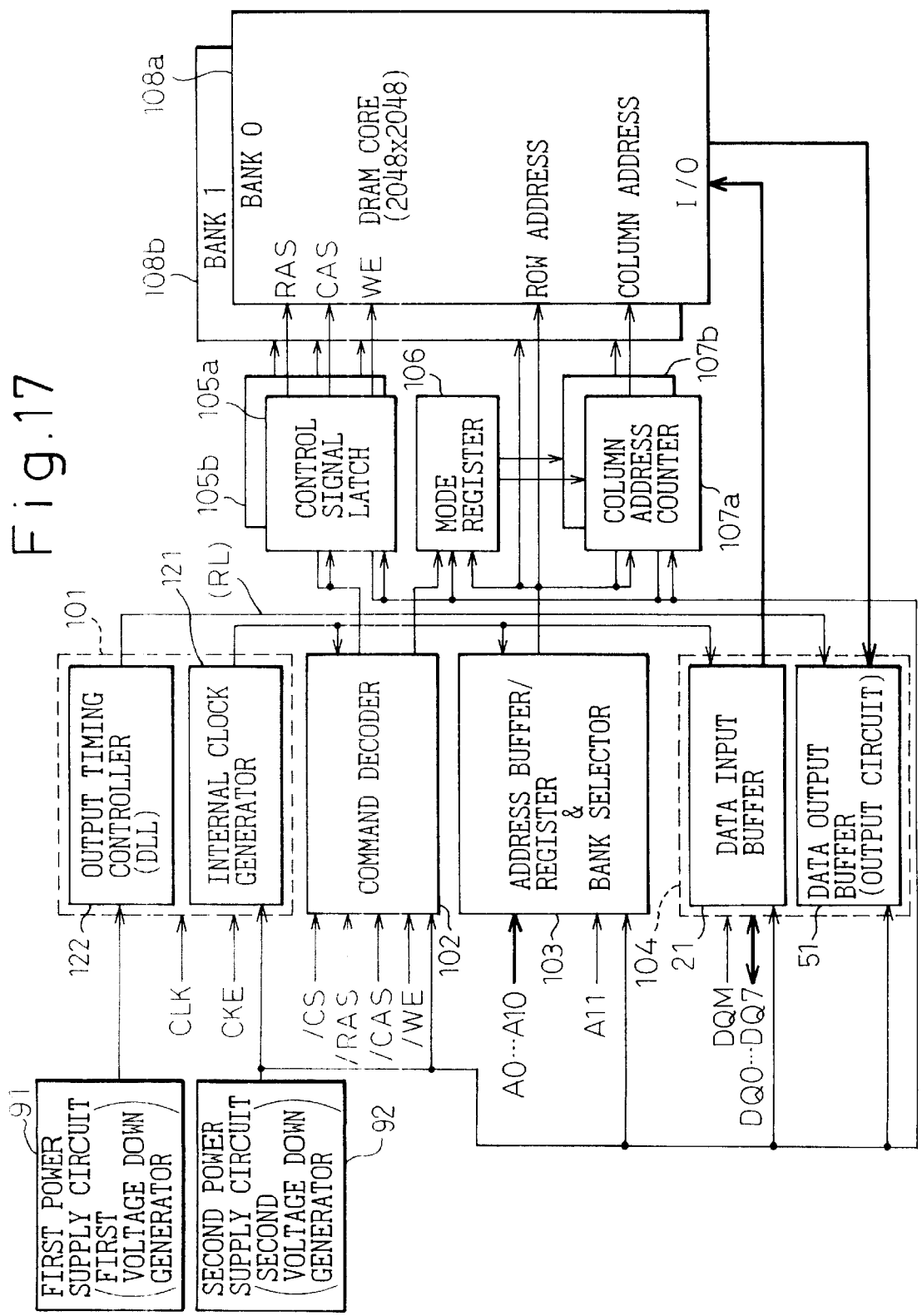
FIG. 17 is a block diagram showing a synchronous DRAM according to the present invention.

In the semiconductor integrated circuit of FIG. 1, the input circuit 21, dummy input circuit 22, output circuit 51, dummy output circuit 52, and DLL circuit 3 receive a voltage output from the power supply circuit 90. Namely, in the semiconductor integrated circuit according to the related art shown in FIG. 1, an output voltage of the power supply circuit 90 is commonly supplied to the DLL circuit 3 (phase comparator 31, delay controller 32, delay circuit 33, and dummy delay circuit 34) and peripheral circuits except for the DLL circuit 3 (input circuit 21, dummy input circuit 22, output circuit 51, dummy output circuit 52, and the like). Note that the peripheral circuits include command decoder (102), address buffer/register and bank selector (103), mode register (106), and the like, as shown in FIG. 17. Further, the Dll circuit 3 is used to generate the internal clock with high accuracy.

As described above, in the semiconductor integrated circuit of the related art shown in FIG. 1, the DLL circuit 3 (31, 32, 33, 34) and the peripheral circuits (21, 22, 51, 52, and the like) commonly receive the same power supply voltage output from the power supply circuit 90. Therefore, when the peripheral circuits use a large power (large current) of the power supply circuit 90 or when noise is caused in the power supply voltage in an area of the peripheral circuits, the power supply voltage applied to the DLL circuit 3 is lowered or fluctuated by the noise, and the delay caused by the delay circuit 33 (34) is changed (fluctuated), so that the phase comparison operation of the phase comparator 31 should be frequently carried out. Namely, the internal clock output from the DLL circuit 3 is not stable and the accuracy (synchronization with the external clock) of the internal clock becomes decreased. In addition, the internal clock output from the DLL circuit 3 may include jitter.

Below, preferred embodiments of a semiconductor integrated circuit according to the present invention will be described with reference to the accompanying drawings.

Figure 2:
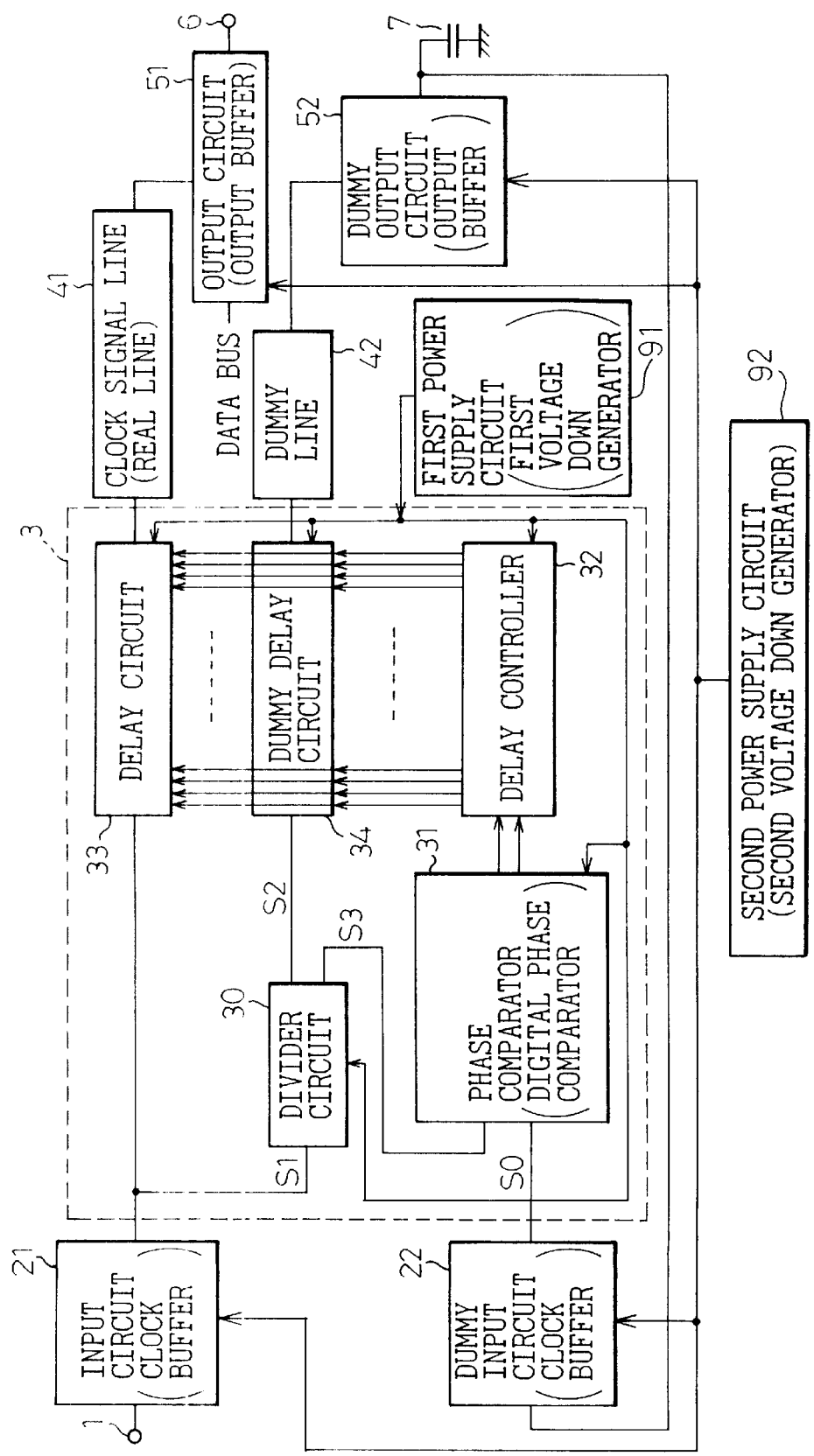
FIG. 2 is a block diagram showing an embodiment of a semiconductor integrated circuit according to the present invention.

FIG. 2 shows an embodiment of a semiconductor integrated circuit according to the present invention. In FIG. 2, reference numeral 1 denotes a clock input pad, 21 denotes an input circuit (clock buffer), 22 denotes a dummy input circuit (clock buffer), and 3 denotes a DLL circuit. Further, reference numeral 41 denotes a clock signal line (real line), 42 denotes a dummy line, 51 denotes an output circuit (output buffer: object circuit), 52 denotes a dummy output circuit (output buffer), 6 denotes a data output pad, 7 denotes a dummy load capacitor, 91 denotes a first power supply circuit (first voltage down generator), and 92 denotes a second power supply circuit (second voltage down generator).

As shown in FIG. 2, the DLL circuit 3 comprises a divider (frequency divider) circuit 30, a phase comparator (digital phase comparator) 31, a delay controller 32, a delay circuit 33, and a dummy delay circuit 34. The divider circuit 30 receives an external clock CLK (signal S1: first control signal) through the input circuit 21, and a frequency of the external clock CLK is divided by the divider circuit 30 and output. Namely the divider circuit 30 supplies a first output signal (signal S2) to the dummy delay circuit 34, and also supplies a second output signal (signal S3) to a first input of the phase comparator 31. Note that the first output signal (S2) of the divider circuit 30 is supplied to a second input (signal S0) of the phase comparator 31 through the dummy delay circuit 34, dummy line 42, dummy output circuit 52, and dummy input circuit 22, and the phase comparator 31 controls the delay controller 32 by carrying out the phase comparison between the signals S3 and S0. The output signal (second control signal: internal clock) of the delay circuit 33 is supplied to the output circuit (object circuit) 51 through the real line 41 as an output signal of the DLL circuit 3.

The delay controller 32 controls the delay circuit 33 and the dummy delay circuit 34 to apply the same delay (delay value) in accordance with output signals (comparison result) of the phase comparator 31. Therefore, the delay (delay time) caused by the input circuit 21, delay circuit 33, real line 41, and output circuit 51 are removed, and the internal clock signal for the output circuit 51 is supplied at the same timing of inputting the external clock CLK.

By the way, when one period (clock cycle) of the external clock CLK is shorter than the total delay of the input circuit 21, output circuit 51, real line (signal line) 41, and the like, a synchronous internal clock cannot be generated by synchronizing with one clock cycle preceding timing of the external clock CLK by using the DLL circuit 3. Therefore, in this embodiment, when the one clock cycle (one period) of the external clock CLK is shorter than the delay of the signal line, and the like, the internal clock is generated by synchronizing with the two clock cycle preceding timing of the external clock CLK. Namely, the phase comparator 31 carries out the phase comparison operation (phase comparison process) at the timing of two clock cycle delayed timing of the external clock CLK.

In this embodiment, a rising edge of the internal clock output from the DLL circuit 3 and a rising edge of the two-clock-cycle delayed external clock input to the DLL circuit 3 are synchronized (locked) by the phase comparator 31 (phase comparison operation). Namely, in the present embodiment, as shown in FIG. 2, a divider circuit 30 for receiving an output signal of the input circuit 21 is provided, a first output signal S2 of the divider circuit 30 is supplied to the dummy delay circuit 34, and a second output signal S3 of the divider circuit 30 is supplied to a first input of the phase comparator 31.

Figure 3:
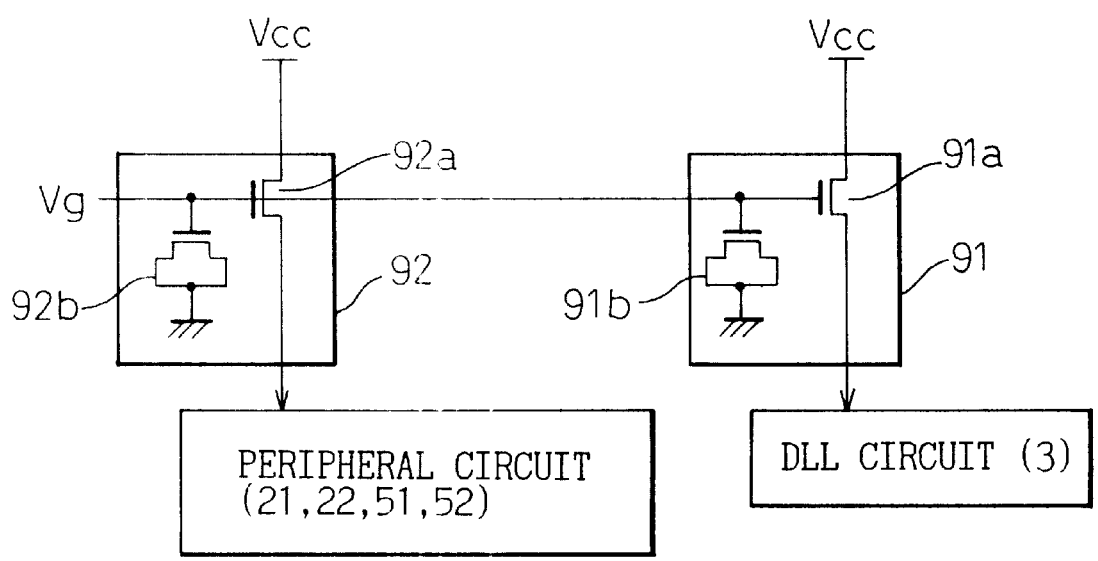
FIG. 3 is a diagram showing a main portion of the semiconductor integrated circuit of FIG. 2.

FIG. 3 shows a main portion of the semiconductor integrated circuit of FIG. 2.

As shown in FIGS. 2 and 3, in the semiconductor integrated circuit of the present embodiment, two power supply circuits 91 and 92 are provided. Namely, a first power supply circuit (first voltage down generator) 91 is a special power supply circuit only for the DLL circuit 3, and thus an output voltage of the first power supply circuit 91 is applied to the divider circuit 30, phase comparator 31, delay controller 32, delay circuit 33, and dummy delay circuit 34 constituting the DLL circuit 3.

As shown in FIGS. 2 and 3, a second power supply circuit (second voltage down generator) 92 is provided for the circuits (peripheral circuits) except for the DLl circuit 3. Namely, in the semiconductor integrated circuit of FIG. 2, an output voltage of the second power supply circuit 92 is applied to the input circuit 21, dummy input circuit 22, output circuit 51, and dummy output circuit 52. Note that the peripheral circuits include command decoder (102), address buffer/register and bank selector (103), mode register (106), and the like, as shown in FIG. 17.

As described above, according to the semiconductor integrated circuit of the present embodiment, a first power supply circuit 91 for a DLL circuit (3: 31, 32, 33, 34) and a second power supply circuit 92 for peripheral circuits (21, 22, 31, 52, and the like) except for the DLL circuit are provided. Therefore, when the peripheral circuits use a large power (large current) of the second power supply circuit 91 or when a noise is caused in an power supply voltage generated by the second power supply circuit 91 in an area of the peripheral circuits, an power supply voltage, which is generated by the first power supply circuit 91, is not lowered or fluctuated and is applied to the DLL circuit 3 without receiving the influence of the power supply voltage generated by the second power supply circuit 92. Namely, when noise is included in an output voltage of the second power supply circuit 92, the DLL circuit 3 receives another output voltage of the first power supply circuit 91 without receiving the influence of the noise, so that the DLL circuit 3 can generate an internal clock which is stable and accurately synchronized with an external clock without including a jitter. In the present embodiment, the DLL circuit 3 is not limited to that shown in FIG. 2, and for example, the DLL circuit 3 shown in FIG. 1 can be used.

As shown in FIG. 3, each of the first and second power supply circuit 91 and 92 is constituted by a voltage down generator. Specifically, the first power supply circuit 91 for the DLL circuit 3 is constituted by transistors 91a and 91b. A source of the transistor 91a receives a system power source voltage Vcc, and a gate of the transistor 91a receives a control signal Vg. The transistor 91b is constituted as a MOS capacitor for stabilizing a voltage of the control signal Vg, where a source and drain of the transistor 91b are commonly connected to the earth, and a gate of the transistor 91b is connected to the gate (Vg) of the transistor 91a.

Similarly, the second power supply circuit 92 for the peripheral circuits (21, 22, 51, 52) is constituted by transistors 92a and 92b. A source of the transistor 92a receives the system power source voltage Vcc, and a gate of the transistor 92a receives a control signal Vg. The transistor 92b is constituted as a MOS capacitor for stabilizing a voltage of the control signal Vg, where a source and drain of the transistor 92b are commonly connected to ground, and a gate of the transistor 92b is connected to the gate (Vg) of the transistor 92a.

Note that a voltage of the system power supply voltage is, for example, 3.3 volts, and each voltage (VCC0) caused (stepped down) by the first and second power supply circuits 91 and 92 is, for example, 2.4 volts. Further, the control signal (reference voltage) Vg is commonly applied to the gates of the transistors 91a and 92a, the voltage of the control signal Vg is stably maintained by the MOS capacitors 91b and 92b, and thus influences caused by a noise included in the control signal Vg or a voltage fluctuation of the control signal Vg can be neglected in practice. In addition, it is not necessary to provide the second power supply circuit 92 for the peripheral circuits close to the first power supply circuit 91 for the DLL circuit, and the second power supply circuit 92 can be placed at various positions in accordance with a layout pattern of the semiconductor integrated circuit, and the like. Further, the second power supply circuit 92 is not limited to one, but several second power supply circuits 92 can be provided.

Figure 4:
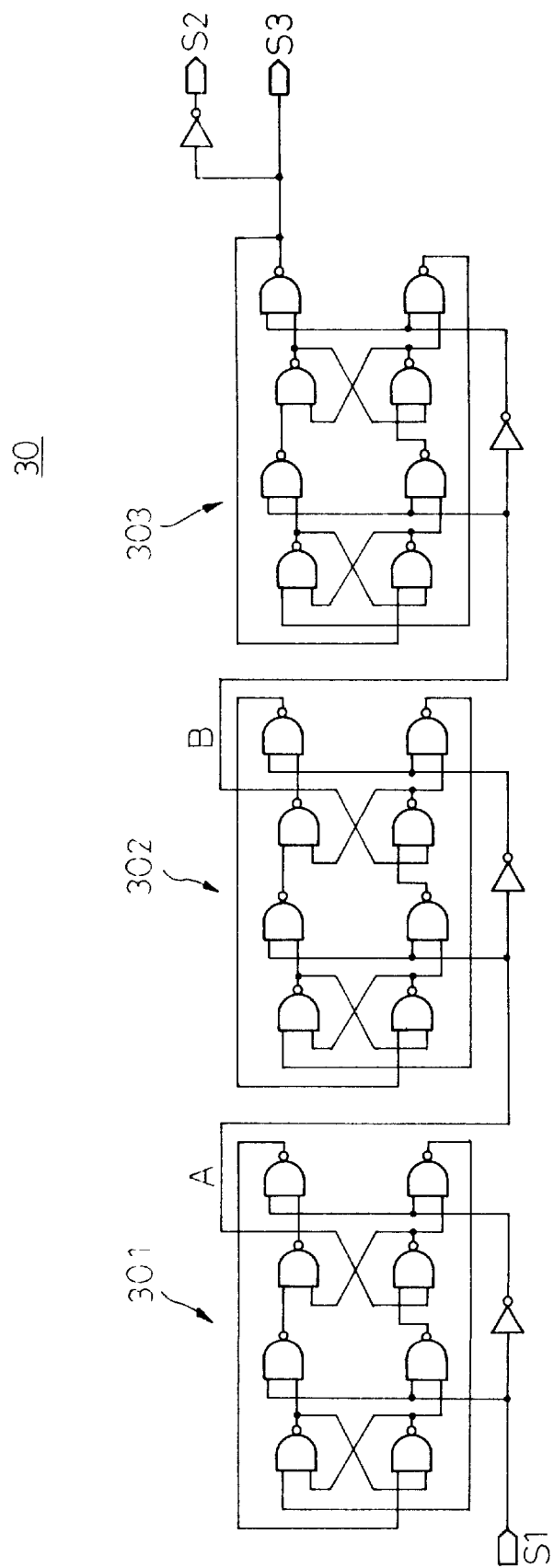
FIG. 4 is a diagram showing an example of a divider circuit provided in the semiconductor integrated circuit of FIG. 2.
Figure 5:
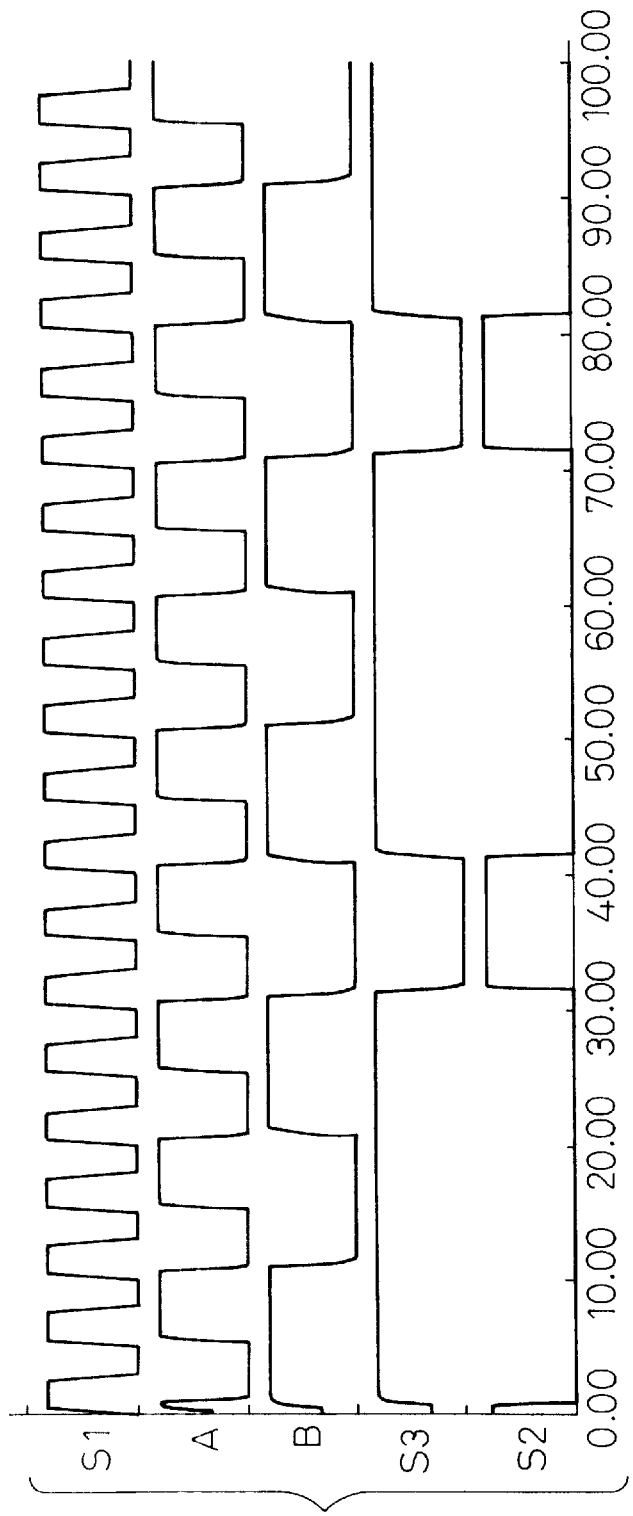
FIG. 5 is a diagram showing waveforms of nodes in the divider circuit of FIG. 4.

FIG. 4 shows an example of a divider circuit provided in the semiconductor integrated circuit of FIG. 2, and FIG. 5 shows waveforms of nodes in the divider circuit of FIG. 4.

As shown in FIG. 3, the divider circuit 30 of FIG. 2 divides the input signal S1 (external clock CLK) into an 8-divisional signal (signal S2 or S3), where a time of two clock cycles of the external clock CLK is at a high level "H" (or low level "L") and a time of six clock cycles of the external clock CLK is at a low level "L" (or high level "H"). Namely, a frequency of the signal S2 (S3) is ⅛ of that of the signal S1, or one clock cycle (period) of the signal S2 is eight times that of the signal S1.

As shown in FIG. 4, the divider circuit 30 is constituted by three counters 301, 302, and 303 each has a plurality of NAND gates and an inverter, and the signal S1 (external clock CLK passing through the input circuit 21) is supplied to the divider circuit 30 and the first and second output signals S2 and S3 (with reference to FIG. 5) are generated therefrom. Note that, in FIG. 5, reference A denotes an output signal of a first stage counter 301, and B denotes an output signal of a second stage counter 302. Further, the divider circuit 30 is not limited to the circuit of FIG. 4 (which is constituted by three counters), but the divider circuit 30 can be constituted by a circuits combining various logic gates.

FIG. 6 is a timing chart showing an operation of the semiconductor integrated circuit employing the divider circuit of FIG. 4.

As shown in FIG. 6, the divider circuit 30 receives the signal S1 (external clock CLK) which is the output signal of the input circuit 21, and generates a signal S2 (first output signal) having a clock cycle corresponding to eight clock cycles of the external clock CLK and a signal S3 (second output signal) which is an inverted signal of the signal S2. Note that, in the signal S2, a period corresponding to two clock cycles of the external clock CLK (with reference to a mark Ta in FIG. 6) is at a high level "H", and a period corresponding to six clock cycles of the external clock CLK (with reference to a mark Tb in FIG. 6) is at a low level "L". The first output signal S2 of the divider circuit 30 is supplied to the dummy delay circuit 34, and the second output signal S3 of the divider circuit 30 is supplied to an input (first input) of the phase comparator 31. Note that the signal S0, which is supplied to another input (second input) of the phase comparator 31, is a signal corresponding to the first output signal S2 delayed by the dummy delay circuit 34, dummy line 4, dummy output circuit 52, and dummy input circuit 22.

The phase comparator (digital phase comparator) 31 compares a rising timing of the second output signal S3 of the divider circuit 30 and a rising timing of the signal S0, and the delay controller (shift register) 32 controls to apply the same delay to the delay circuit 33 and the dummy delay circuit 34 in accordance with the comparison result of the phase comparator 31. Namely, the DLL circuit 3 outputs an internal clock signal which is a signal corresponding to the signal S1 output from the input circuit 21 having a delay caused by the delay circuit 33. Therefore, in the DLL circuit 3, the internal clock can be caused by synchronizing with two clock cycle preceding timing of the external clock signal CLK, and thereby the DLL circuit 3 can be applied to a high speed SDRAM.

In the above embodiment, when changing the period Ta of the first output signal S2 of the divider circuit 30, the DLL circuit 3 can generate the internal clock signal by synchronizing with optional clock cycle preceding timing of the external clock signal CLK. For example, assuming that the period Ta of the signal S2 is determined to three clock cycles of the external clock CLK, the DLL circuit 3 generates an internal which is synchronized with three clock cycle preceding timing of the external clock signal CLK. Further, when changing the period Tb (Ta+Tb) of the first output signal of the divider circuit 30, the timing for carrying out the phase comparison operation can be changed.

Therefore, in the present embodiment, the divider circuit 30 generates the first signal S2 where a time corresponding to Y periods of the signal S1 (external clock signal CLK) is at a high level "H" and a time corresponding to Z periods of the signal S1 is at a low level "L", and the comparing process (comparing operation) of the phase comparator 31 is carried out by using the first and second output signals S2 and S3 at a timing of delaying Y periods (clock cycles) of the signal S1, where Y denotes an integer number of two or more, and Z denotes an integer number. Further, in the present embodiment, the divider circuit 30 generates the first and second output signals S2 and S3 by X-dividing the signal S1 (external clock CLK), and the comparing operation of the phase comparator 31 is carried out every X periods (clock cycles) of the external clock CLK, where X denotes an integer number of two or more.

As described above, in the present embodiment, the phase comparison operation of the phase comparator 31 is carried out every X periods (for example, one time in eight clock cycles of the external clock CLK), and the control operation of the delay circuit 33 (dummy delay circuit 34) by the delay controller 32 is carried out every X periods (for example, one time in eight clock cycles of the external clock CLK), and thus the fluctuations of the internal clock signal can be cancelled when causing voltage fluctuations of a row address strobe signal (RAS signal) and a column address strobe signal (CAS signal) or a noise.

Figure 7B:
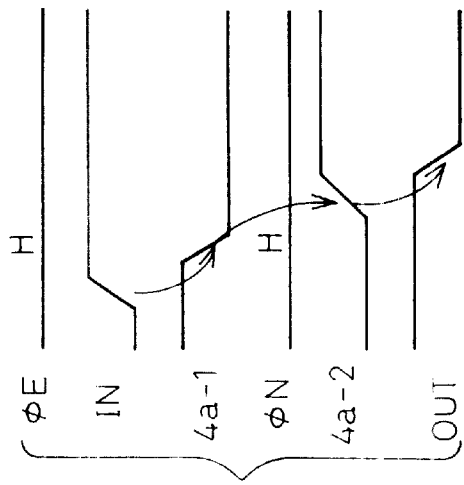
FIGS. 7A, 7B, and 7C are diagrams showing an example of a delay circuit of a semiconductor integrated circuit according to the present invention.
Figure 7A:
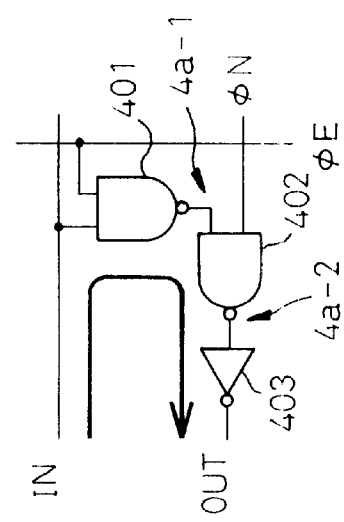
Figure 7C:
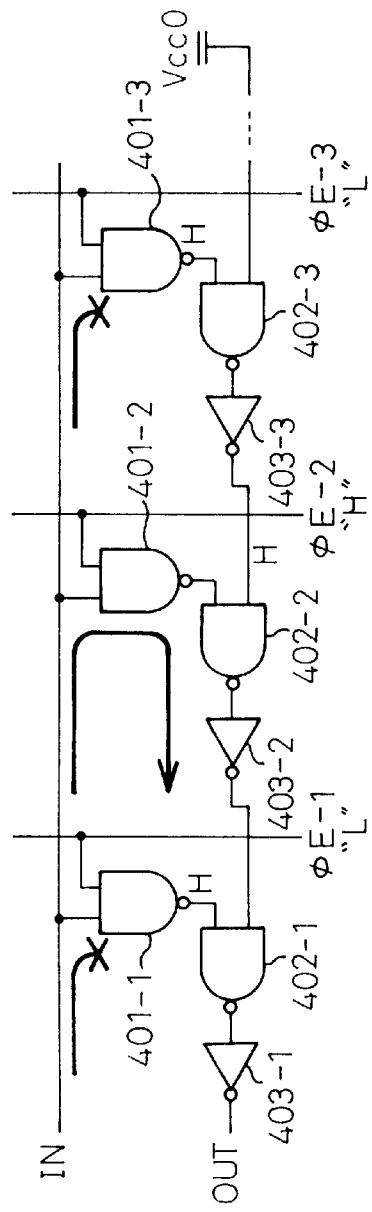

FIGS. 7A to 7C show an example of a delay circuit 33, 34 of a semiconductor integrated circuit according to the present invention, in which FIG. 7A shows a 1-bit delay element, FIG. 7B is a time chart showing the operation of the 1-bit delay element, and FIG. 7C shows cascaded 1-bit delay elements.

As shown in FIG. 7A, the 1-bit delay element has two NAND gates 401 and 402 and an inverter 403. An enable signal φE is high in FIG. 7B to activate the 1-bit delay element. The 1-bit delay element receives an input signal IN and a signal φN, which is an output signal of another 1-bit delay element on the right side, and provides an output signal OUT. Nodes 4a-1 and 4a-2 provide waveforms shown in FIG. 7B. The output signal OUT is a signal φN to another 1-bit delay element on the left side.

When the signal φN is at a low level "L" (low), the output signal OUT is always low. If the signal φN is at a high level "H" (high) and the signal φE is low, the output signal OUT is high. If the signal φN is high with the signal φE being high and the input signal IN being low, the output signal OUT is high, and with the input signal IN being high, the output signal OUT is low.

If the input signal IN rises with the enable signal φE being high, the input signal IN is transmitted through a path indicated with an arrow mark. If the enable signal φE is low, the input signal IN is blocked from the path.

In FIG. 7C, the 1-bit delay elements are cascaded to form the delay circuit. Although FIG. 7C shows only three 1-bit delay elements, many elements are cascaded in reality, and each element is provided with a signal line such as φE-1, φE-2, or φE-3 each for transmitting an enable signal φE. These enable signals are controlled by a delay control circuit (32).

In FIG. 7C, the enable signal φE-2 is high to activate the center 1-bit delay element. If the input signal IN changes from low to high, the NAND gates 401-1 and 401-3 of the left and right 1-bit delay elements block the input signal IN because their enable signals φE-1 and φE-3 are each low.

On the other hand, the NAND gate 401-2 of the center 1-bit delay element passes the input signal IN because its enable signal φE-2 is high. The NAND gate 402-2 thereof also passes the input signal IN because the output signal OUT (φN) of the right 1-bit delay element is high. Then, the center 1-bit delay element provides the output signal OUT of low. If the output signal OUT (φN) of the right 1-bit delay element is low, the output signal OUT of the 1-bit delay element that receives the output signal is always low. Accordingly, the output signal OUT of the center 1-bit delay element is transmitted through the NAND gate and inverter of the left 1-bit delay element and is provided as a final output signal.

In this way, the input signal IN is transmitted through an activated 1-bit delay element, to form a final output signal. Namely, controlling the enable signal φE of a required 1-bit delay element to high will control a delay in the delay controller. The delay of a 1-bit delay element is determined by the total signal propagation time of the NAND gates and inverter of the element and forms a unit delay time. A total delay time is calculated by multiplying the number of 1-bit delay elements passed by the input signal IN by the unit delay time.

Figure 8:
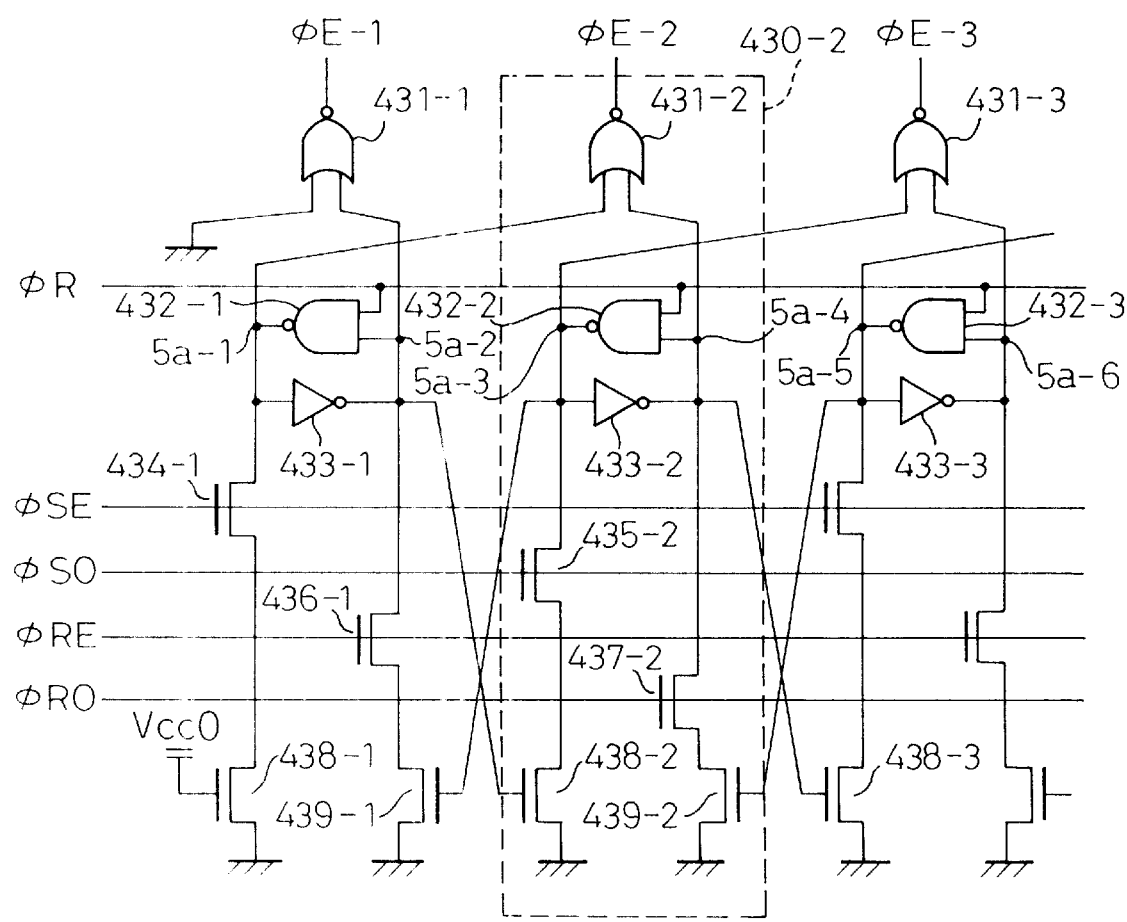
FIG. 8 is a circuit diagram showing an example of a delay control circuit of a semiconductor integrated circuit according to the present invention.

FIG. 8 shows an example of a delay control circuit of a semiconductor integrated circuit according to the present invention.

The delay control circuit comprises of 1-bit control elements among which one surrounded with a dotted line in FIG. 8 is a 1-bit control element 430-2. Each element provides an enable signal φE to a corresponding one of the 1-bit delay elements (FIG. 7).

The 1-bit control element 430-2 comprises of a flip-flop having a NAND gate 432-2 and an inverter 433-2, transistors 435-2, 437-2, 438-2, and 439-2, and a NOR gate 431-2. The gate of the transistor 438-2 is connected to a node 5a-2 of a front 1-bit control element. The gate of the transistor 439-2 is connected to a node 5a-5 of a rear 1-bit control element. Incremental signals, i.e., set signals φSE and φSO and decremental signals, i.e., reset signals φRE and φRO are connected alternately to the 1-bit control elements.

In the center 1-bit control element 430-2, the gate of the transistor 435-2 receives the set signal φSO, and the gate of the transistor 437-2 receives the reset signal φRO. The gates of the corresponding transistors of the front and rear 1-bit control elements receive the set signal φSE and reset signal φRE. The NOR gate 431-2 receives a signal from a node 5a-1 of the front element and a signal from a node 5a-4 of its own. A signal φR resets the delay controller. The signal φR is once set to low when a power source is turned on and is fixed to high thereafter.

Figure 9:
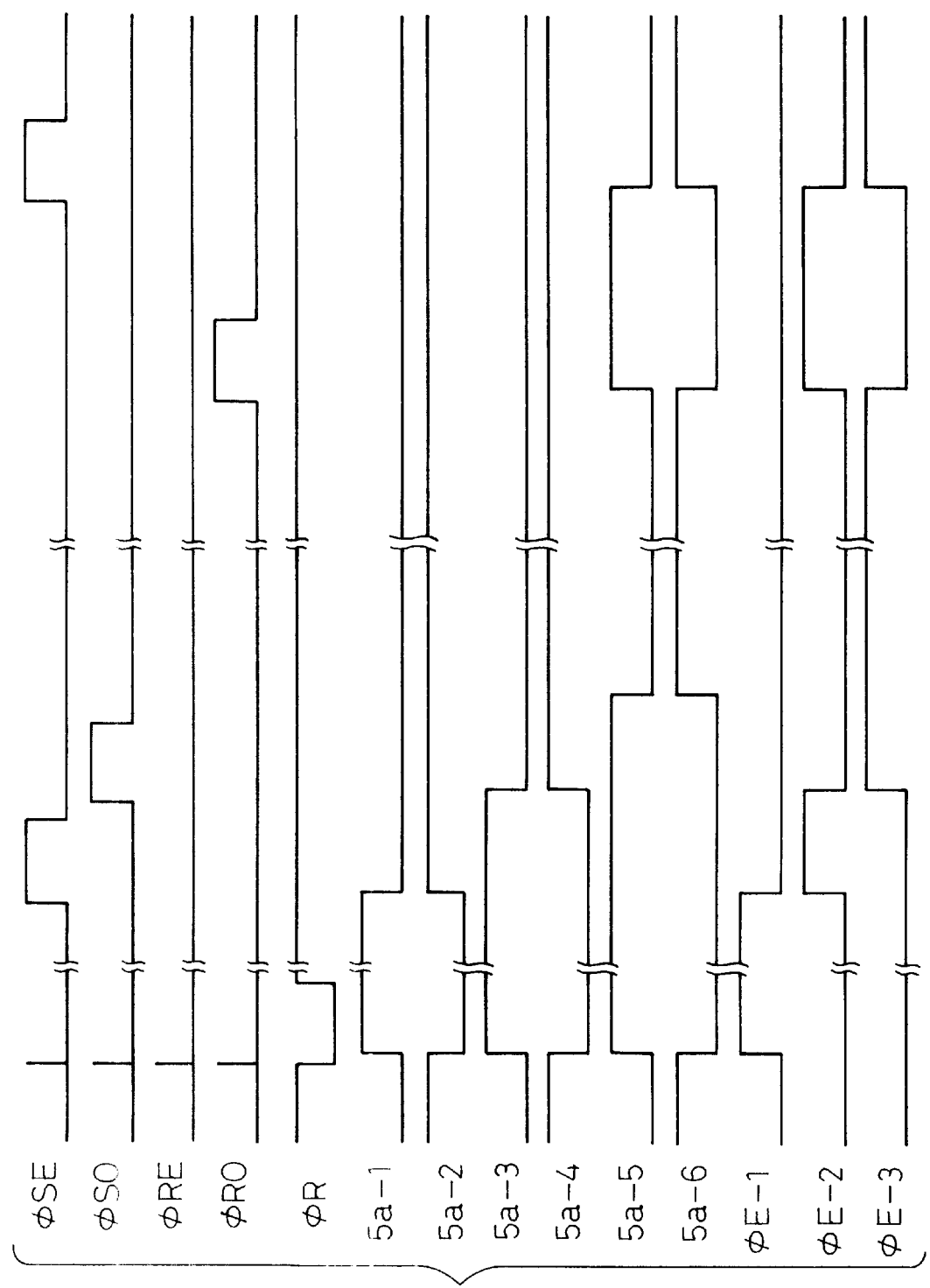
FIG. 9 is a timing chart showing an operation of the delay control circuit of FIG. 8.

FIG. 9 is a timing chart showing the operation of the circuit of FIG. 8.

The reset signal φR is once set to low so that the nodes 5a-1, 5a-3, and 5a-5 are set to high and the nodes 5a-2, 5a-4, and 5a-6 to low. To carry out an incremental operation, the incremental signals, i.e., the set signals φSE and φSO are set to high and low alternately.

When the set signal φSE is changed from low to high, the node 5a-1 is grounded to low, and the node 5a-2 is changed to high. Accordingly, the enable signal φE-1 changes from high to low. This state is latched by the flip-flop, and therefore, the enable signal φE-1 keeps the low level even if the set signal φSE returns to low. When the node 5a-1 changes to low, the enable signal φE-2 changes from low to high. When the node 5a-2 changes to high, the transistor 438-2 is turned on. When the set signal φSO changes from low to high, the node 5a-3 is grounded to low, and the node 5a-4 changes to high. As a result, the enable signal φE-2 changes from high to low. This state is latched by the flip-flop, and therefore, the enable signal φE-2 keeps the low level even if the set signal φSO returns to low.

When the node 5a-3 changes to low, the enable signal φE-3 changes from low to high. Although FIG. 9 shows each one pulse of the set signals φSE and φSO, many 1-bit control elements are connected to one another in reality. Accordingly, if the set signals φSE and φSO are alternately set to high and low, the 1-bit control element that provides the enable signal φE of high level will shift to the right sequentially. If the comparison result from the phase comparator 31 indicates that a delay must be increased, the set signals φSE and φSO will alternately be set to high and low.

When the incremental (set) signals φSE and φSO and decremental (reset) signals φRE and φRO are kept low, a fixed 1-bit control element will provide an enable signal φE of high level. Accordingly, if the comparison result from the phase comparator 31 indicates to keep a delay, the signals φSE, φSO, φRE, and φRO are held low.

When carrying out a decremental operation, the reset signals φRE and φRO are alternately provided so that the 1-bit control element that provides the enable signal φE of high level may shift to the left sequentially.

In this way, the delay control circuit of FIG. 8 shifts the 1-bit control element that provides an enable signal φE of high level element by element, to control the 1-bit delay elements of FIG. 7C element by element.

Figure 10:
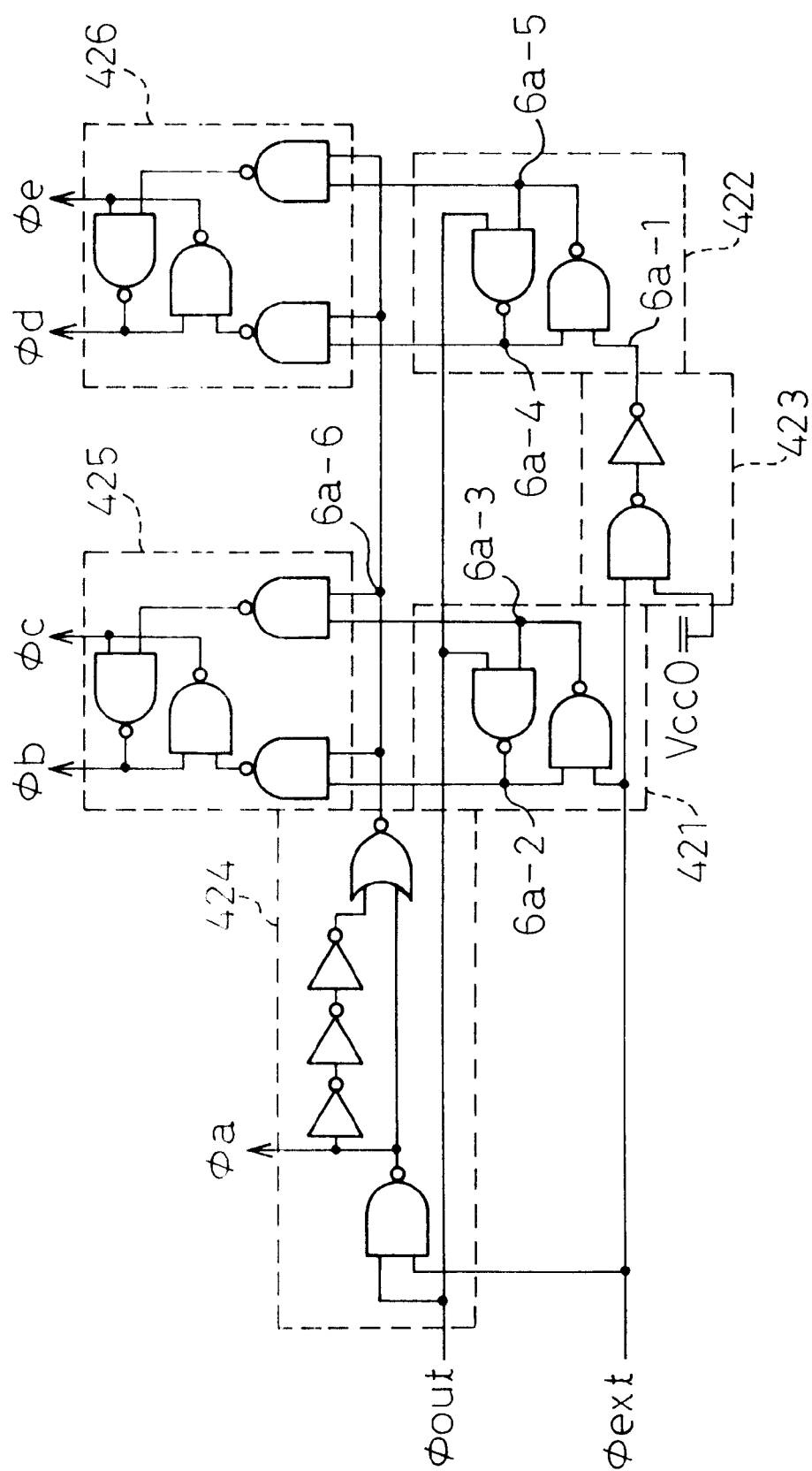
FIG. 10 is a circuit diagram showing an example of a phase comparator (phase comparing section) of a semiconductor integrated circuit according to the present invention.

FIG. 10 shows a phase comparator (phase comparing section) of a semiconductor integrated circuit according to the present invention, and FIGS. 11A to 11C are timing charts showing the operation of the phase comparator circuit.

Figure 12:
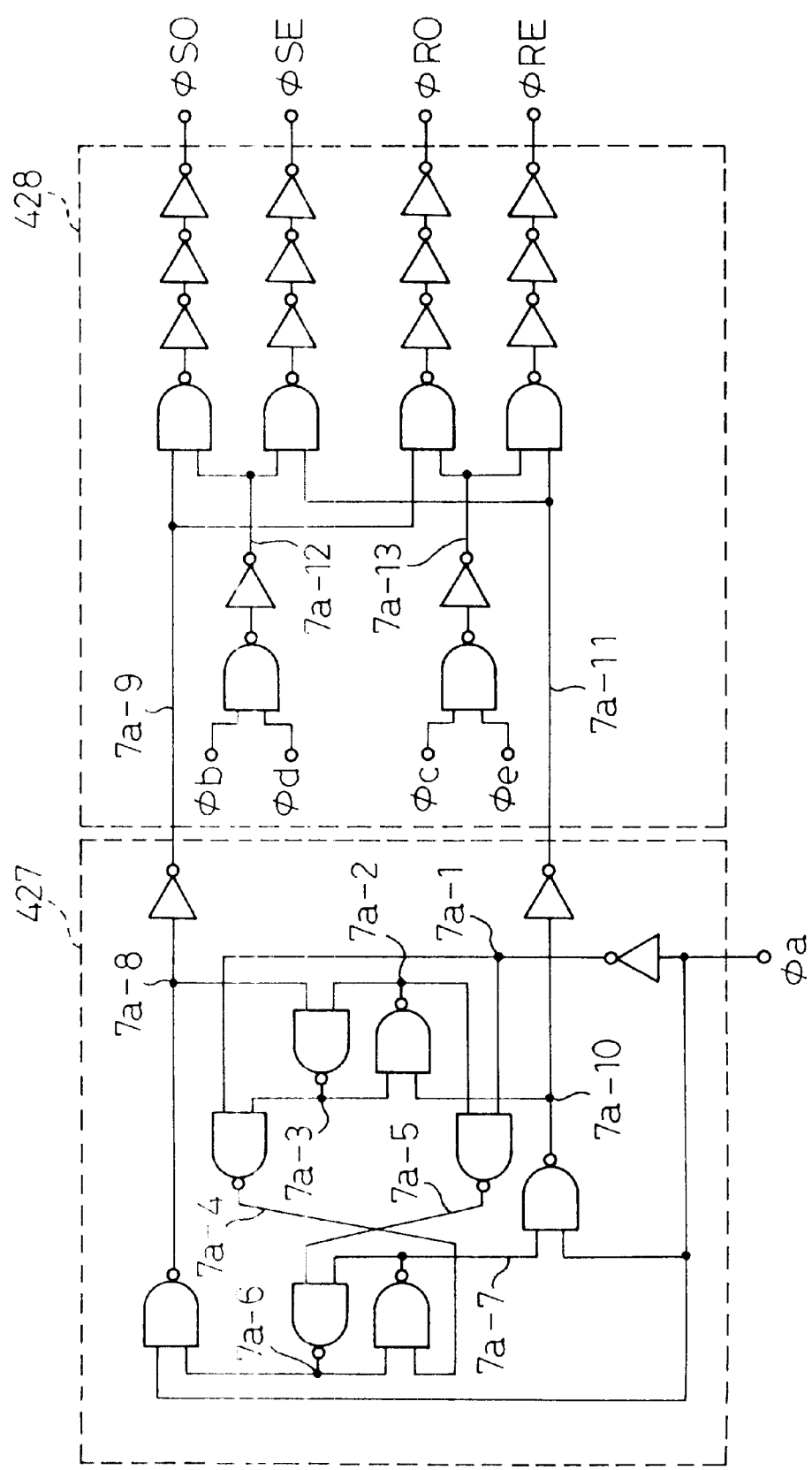
FIG. 12 is a circuit diagram showing an example of a phase comparator (amplifying section) of a semiconductor integrated circuit according to the present invention.

The phase comparator (31) comprises the phase comparing section of FIG. 10 and an amplifying section of FIG. 12.

In FIG. 10, the phase comparing section compares the dummy internal clock signal φout with the external clock signal φext serving as a reference signal. Output signals φa to φe are transferred to the amplifying section.

The phase comparing section is composed of flip-flops 421 and 422 each having two NAND gates, latches 425 and 426 for latching the states of the flip-flops 421 and 422, respectively, a generator 424 for generating an activation signal for the latches 425 and 426, and a 1-delay circuit 423 for obtaining a phase allowance for the external clock signal φext.

FIG. 11A shows that the phase of the dummy internal clock signal φout is ahead of the phase of the reference signal φext. Namely, the signal φout changes from low to high before the signal φext shows the same change. When the signals φout and φext are each at low level, nodes 6a-2 to 6a-5 of the flip-flops 421 and 422 are each high. When the signal φout changes from low to high, the nodes 6a-2 and 6a-4 change from high to low. Thereafter, the signal φext changes from low to high, and after one unit delay, the node 6a-1 changes from low to high. In spite of these changes, the terminal voltages of the flip-flops 421 and 422 are unchanged because they are already fixed. As a result, the node 6a-2 is continuously low, 6a-3 high, 6a-4 low, and 6a-5 high.

When the signal φext changes from low to high, the output signal φa of the generator 424 changes from high to low, to apply a high pulse to the node 6a-6. Since the node 6a-6 is connected to the NAND gates of the latches 425 and 426, the NAND gates are temporarily activated, and the latches 425 and 426 latch the terminal voltages of the flip-flops 421 and 422. As a result, the output signal φb changes to high, φc to low, φd to high, and φe to low.

FIG. 11B shows that the dummy internal clock signal φout and reference signal φext have substantially the same phase and change from low to high substantially at the same time. Within a time difference between a rise of the signal φout and a rise of the node 6a-1, the signal φout changes from low to high. At this time, the signal φext changes from low to high, so that the node 6a-3 of the flip-flop 421 changes from high to low. In the flip-flop 422, the node 6a-1 maintains a low level, and the node 6a-4 changes from high to low. Thereafter, the node 6a-1 changes from low to high. At this time, the state of the flip-flop 422 is unchanged. The node 6a-6 provides a high pulse, and the latches 425 and 426 store the states. As a result, the output signal φb changes to low, φc to high, φd to high, and φe to low.

FIG. 11C shows that the phase of the dummy internal clock signal φout is behind the phase of the reference signal φext and that the signal φout changes from low to high after the same change in the signal φext. In this case, the signal φext causes changes in the flip-flops 421 and 422, and the nodes 6a-3 and 6a-5 change from high to low. As a result, the output signal φb changes to low, φc to high, φd to low, and φe to high.

In this way, a rise of the reference signal φext is used to determine whether a rise of the dummy internal clock signal φout is ahead, simultaneous, or behind. The determination is latched as values of the output signals φb, φc, φd, and φe. According to these values, it is determined to increment or decrement delays in the delay controllers.

Figure 13:
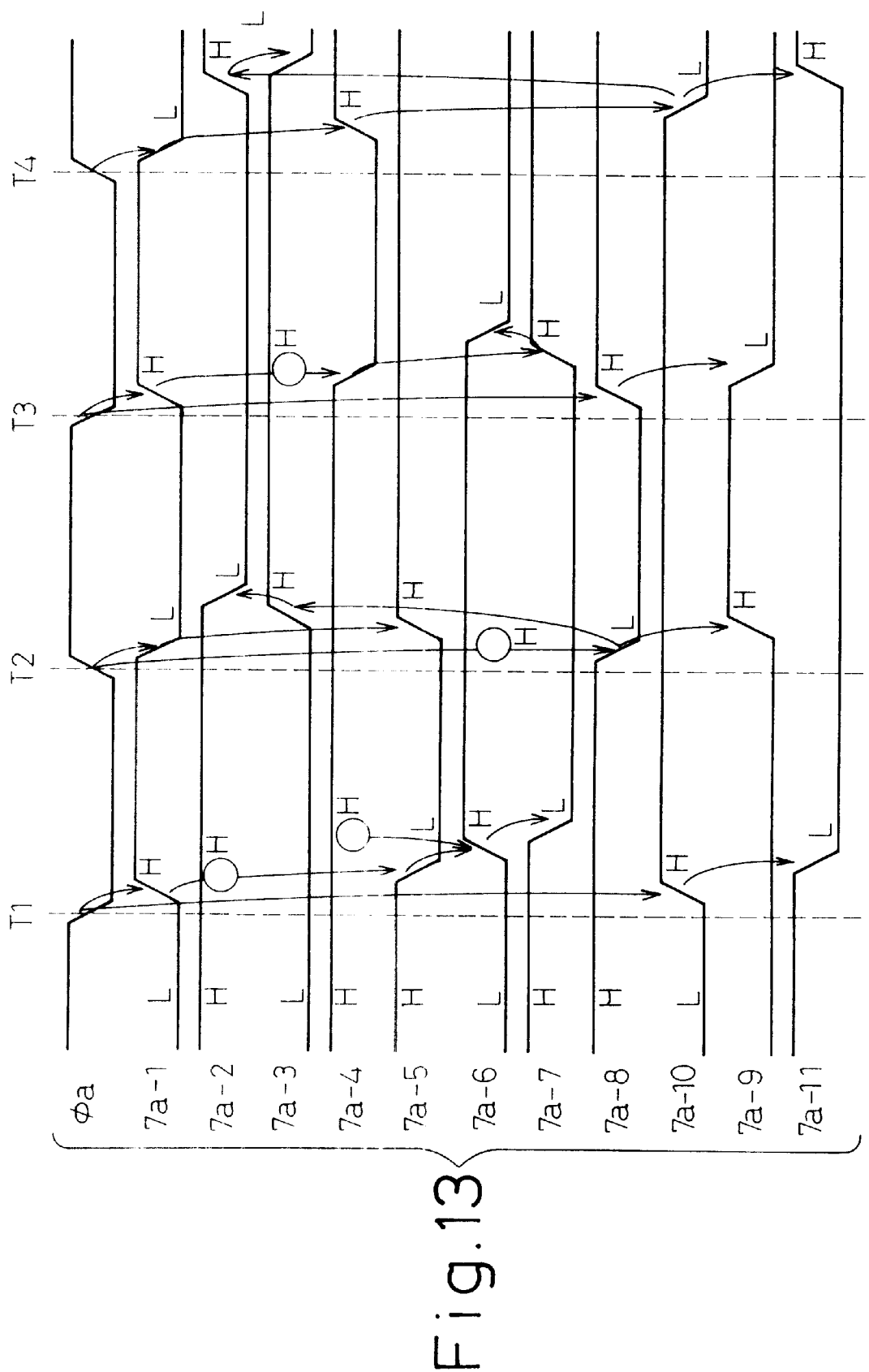
FIG. 13 is a timing chart showing an operation of a JK flip-flop of the amplifying section of FIG. 12.

FIG. 12 shows the amplifying section of the phase comparator 31 of the present invention, and FIG. 13 is a timing chart showing the operation of a JK flip-flop of the amplifying section.

The amplifying section has the JK flip-flop 427 and an amplifier 428 consisting of NAND gates and inverters. The JK flip-flop 427 receives the output signal φa from the phase comparing section of FIG. 10. In response to the level of the signal φa, the voltages of nodes 7a-9 and 7a-11 alternate high and low levels. The amplifier 428 receives and amplifies the outputs of the JK flip-flop 427 and the signals φb to φe.

The operation of the JK flip-flop 427 will be explained with reference to the timing chart of FIG. 13. The signal φa changes from high to low at time T1, and then, nodes 7a-1 and 7a-10 change from low to high. Nodes 7a-5, 7a-6, and 7a-7 change in response to the change at the node 7a-1, but a node 7a-8 shows no change because the signal φa is low. As a result, the output node 7a-9 is unchanged, and the output node 7a-11 changes from high to low. At time T2, the signal φa changes from low to high, and then, the node 7a-8 changes from high to low. The node 7a-10 is unchanged because the node 7a-7 is unchanged. The output node 7a-9 changes from low to high, and the output node 7a-11 is unchanged. In this way, the output nodes 7a-9 and 7a-11 of the JK flip-flop 427 alternately change from high to low and from low to high.

Figure 14:
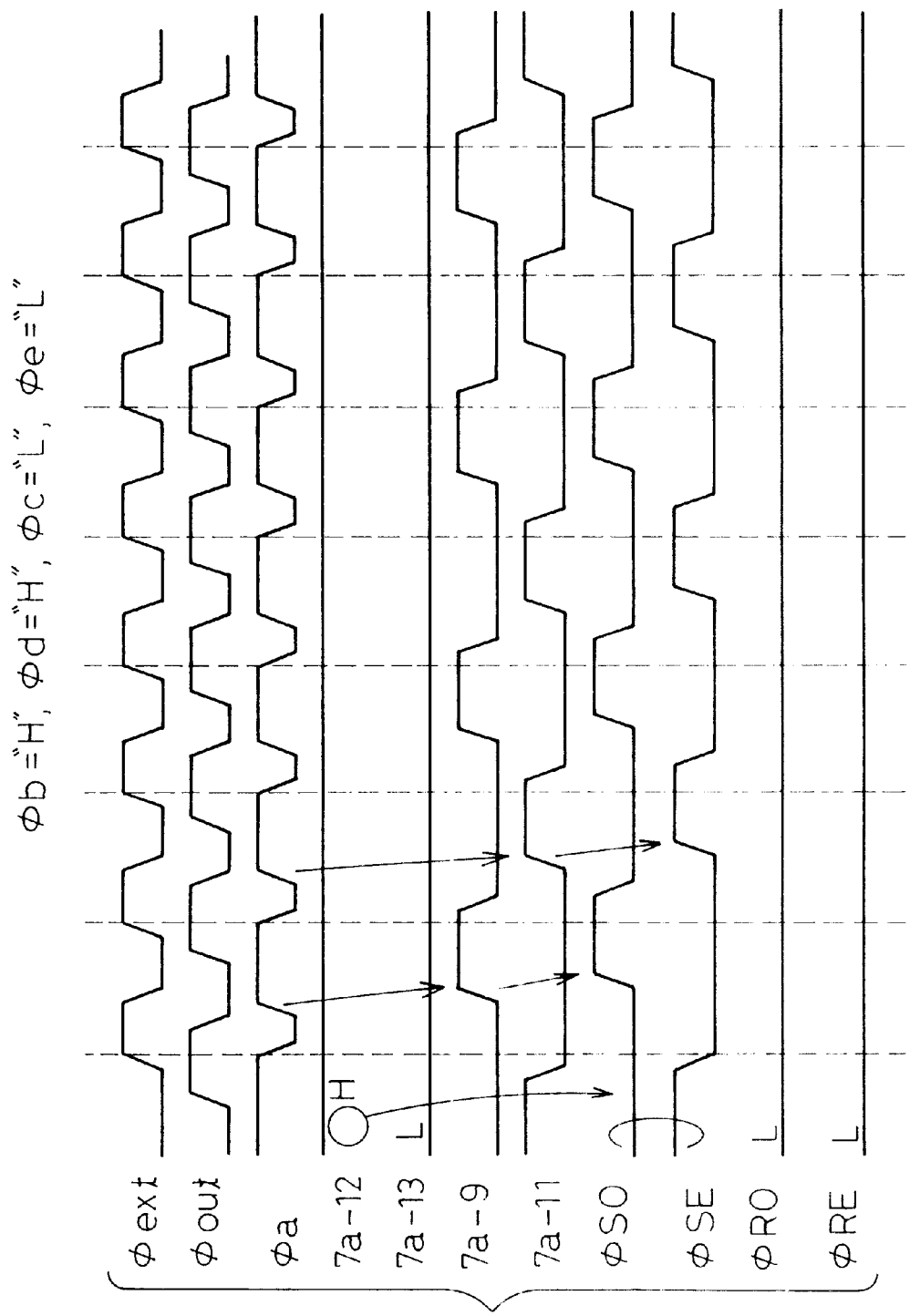
FIG. 14 is a timing chart showing an incremental operation of the amplifying section of FIG. 12.
Figure 15:
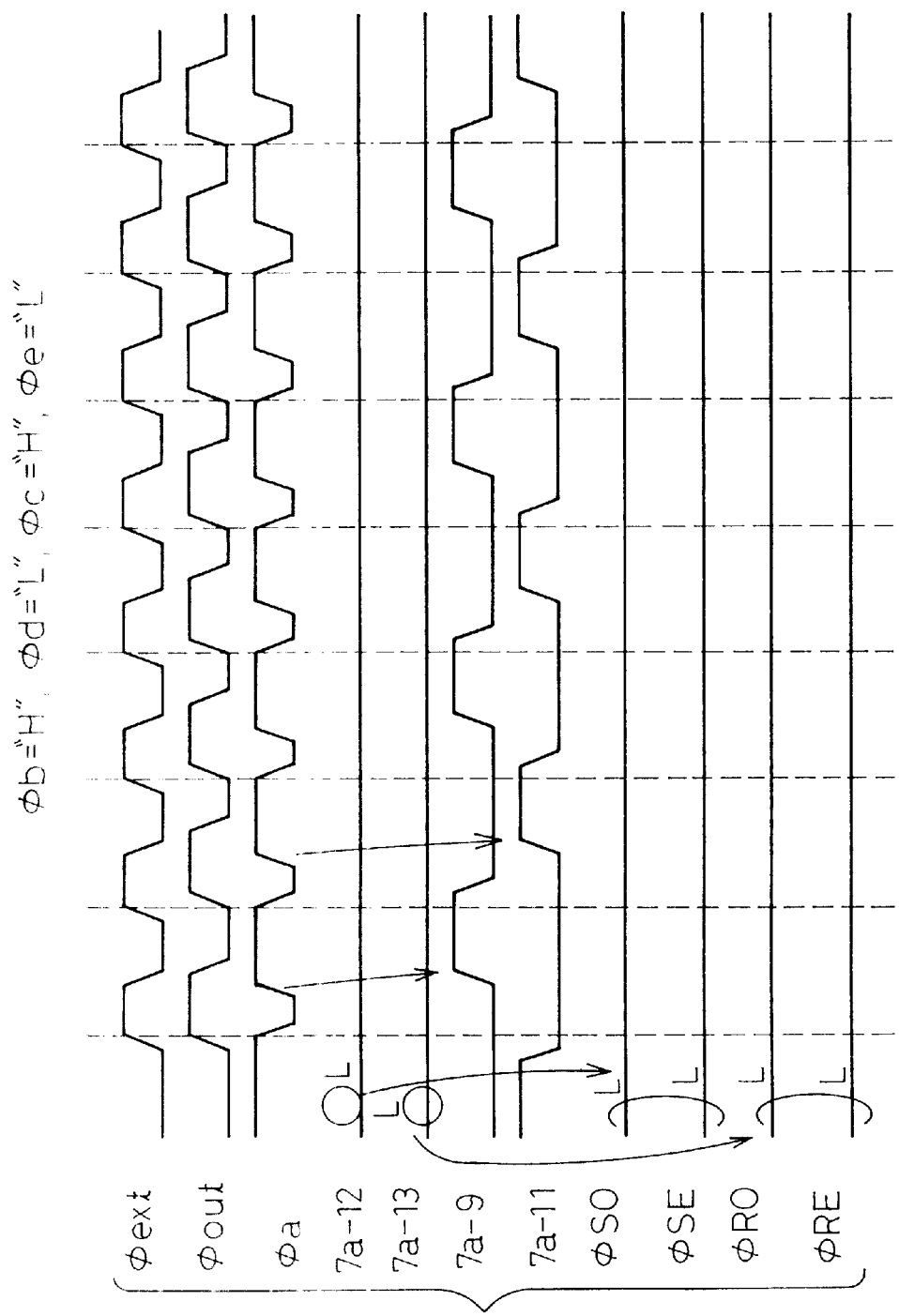
FIG. 15 is a timing chart showing a sustain operation of the amplifying section of FIG. 12.
Figure 16:
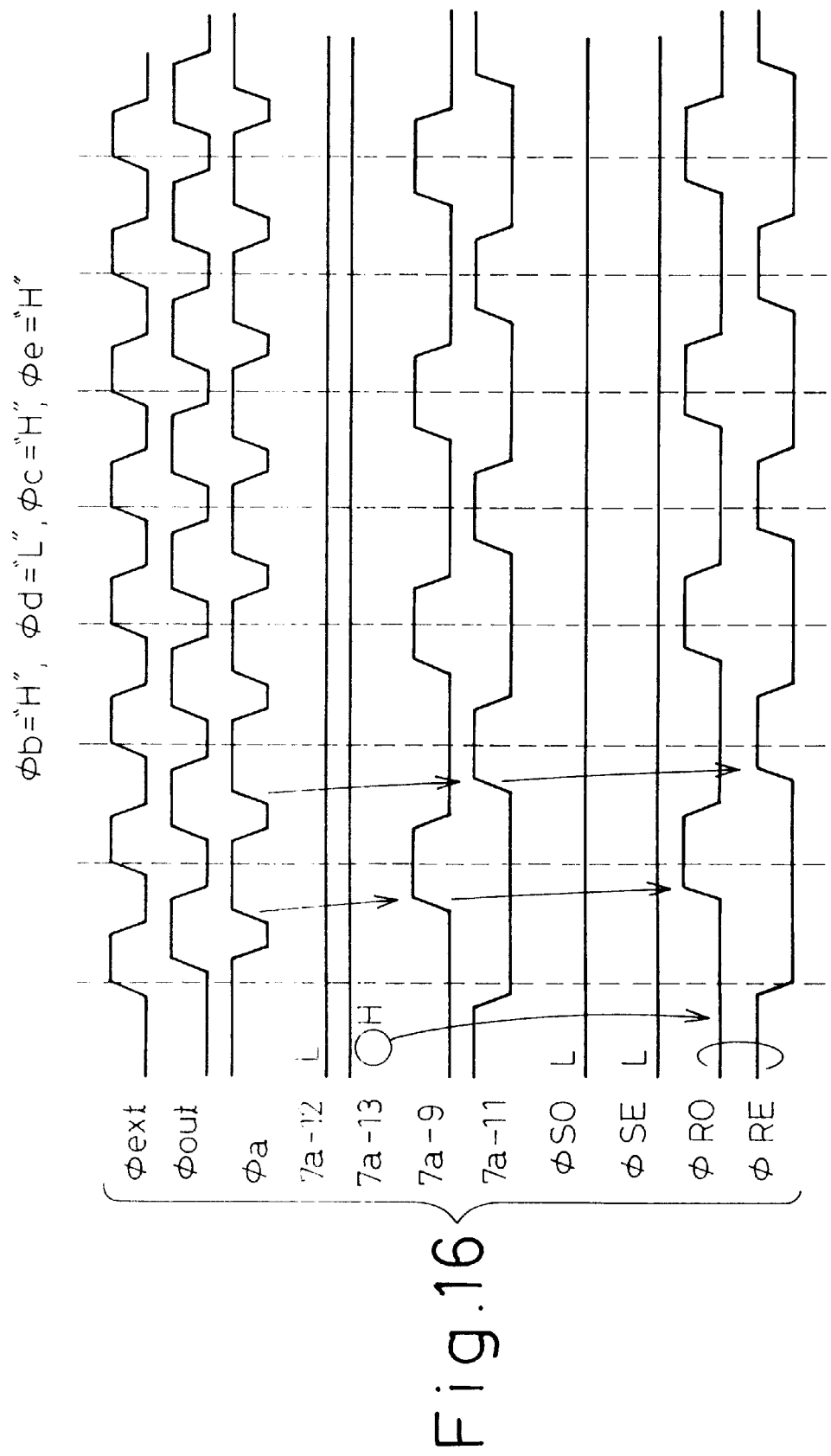
FIG. 16 is a timing chart showing a decremental operation of the amplifying section of FIG. 12.

FIG. 14 is a timing chart showing an incremental operation of the amplifying section of FIG. 12 of the phase comparator, FIG. 15 is a timing chart showing a sustain operation of the same, and FIG. 16 is a timing chart showing a decremental operation of the same.

In FIG. 14, the dummy internal clock signal φout changes from low to high before the same change in the reference signal φext. In this case, the phase comparing section of FIG. 10 provides the signal φb of high, φc of low, φd of high, and φe of low. As a result, a node 7a-12 becomes high, and a node 7a-13 is fixed at low. Although the incremental (set) signals φSO and φSE change in response to the state of the JK flip-flop 427, the decremental (reset) signals φRO and φRE are unchanged because the node 7a-13 is low.

In FIG. 15, the signal φout changes from low to high substantially simultaneously with the reference signal φext. In this case, the phase comparing section of FIG. 10 provides the signal φb of low, φc of high, φd of high, and φe of low. As a result, the nodes 7a-12 and 7a-13 are fixed at low. The set signals φSO and φSE are not influenced by the output of the JK flip-flop, and therefore, the signals φSO, φSE, φRO, and φRE are fixed at low.

In FIG. 16, the signal φout changes from low to high behind the same change in the reference signal φext. In this case, the phase comparing section of FIG. 10 provides the signal φb of low, φc of high, φd of low, and φe of high. As a result, the node 7a-12 is fixed at low, the node 7a-13 is fixed at high, the reset signals φRO and φRE change in response to the state of the JK flip-flop, and the set signals φSO and φSE are unchanged because the node 7a-12 is low.

Figure 18:
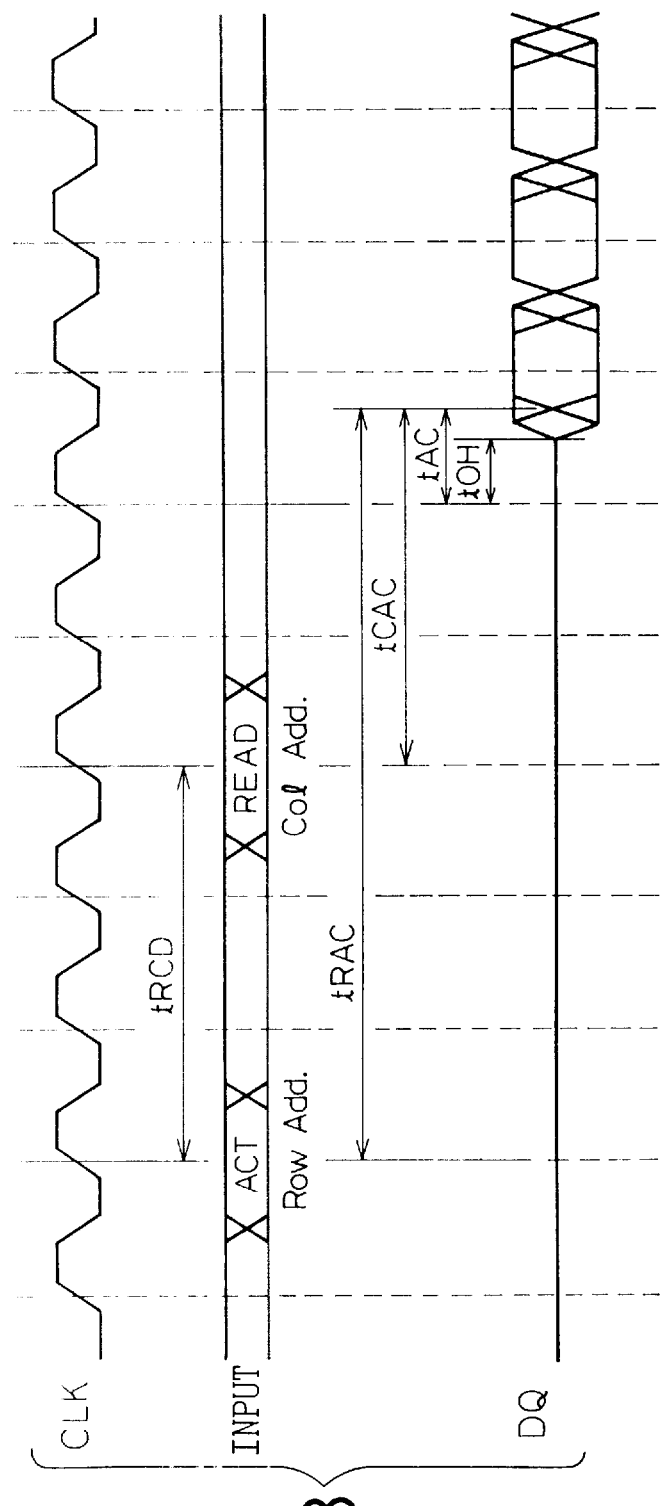
FIG. 18 is a timing chart showing an operation of the synchronous DRAM of FIG. 17.

FIG. 17 shows an SDRAM according to the present invention, and FIG. 18 is a timing chart showing the operation of the SDRAM.

The SDRAM employs a pipeline method and is a 2-bank, 8-bit, 16-M SDRAM.

The SDRAM has DRAM, cores 108a and 108b, a clock buffer 101, a command decoder 102, an address buffer/register and bank address selector 103, an I/O data buffer/register 104, control signal latches 105a and 105b, a mode register 106, and column address counters 107a and 107b. Signals /CS, /RAS, /CAS, and /WE are combined to form a command that specifies an operation mode. The command is decoded by the command decoder 102, and according to a mode specified by the command, circuits are controlled. The signals /CS, /RAS, /CAS, and /WE are also supplied to the latches 105a and 105b that maintain their states until the next command is provided.

Address signals are amplified by the address buffer 103, which provides row addresses for the banks as well as initial addresses for the column address counters 107a and 107b.

The clock buffer 101 has an internal clock generator 121 and an output timing controller 122, which is the DLL circuit of the present invention. The internal clock generator 121 generates an ordinary internal clock signal according to an external clock signal CLK. The output timing controller 122 generates a delay-locked (phase-locked) clock signal after carrying out the delay control of the present invention mentioned above.

The register 104 has a data input buffer 13 and a data output circuit 51. The data output circuit 51 amplifies data read out of the DRAM cores 108a and 108b and provides the data through output pads DQ0 to DQ7 according to the delay-locked clock signal provided by the output timing controller 122. Input data to the pads DQ0 to DQ7 are received by the data input buffer 13. A real line (RL) runs between the output timing controller 122 and the data output circuit 51.

As shown in FIG. 17, an output voltage of a first power supply circuit (first voltage down generator) 91 is only applied to the output timing controller 122 (DLL circuit 3), and an output voltage of a second power supply circuit 92 is applied to peripheral circuits except for the output timing controller 122. Namely, the output voltage of a second power supply circuit 92 is applied to the internal clock generator 121, command decoder 102, address buffer/register and bank selector (address buffer) 103, I/O data buffer/register 104 (data input buffer 21 (22), data output buffer 51 (52)), and column address counter 107a (107b). Note that the DRAM cores 108a and 108b receives a power supply voltage from the other power supply circuit.

Figure 19:
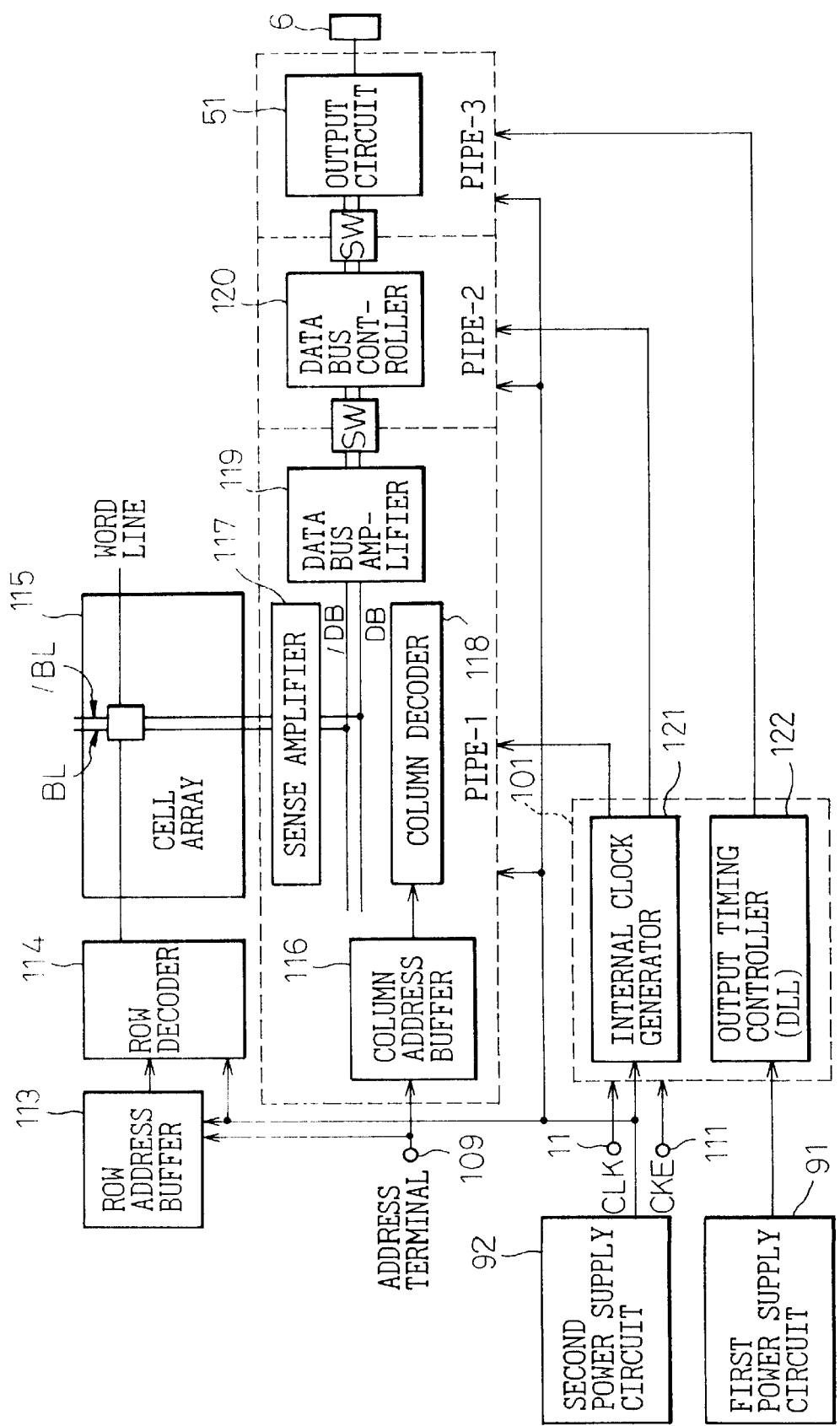
FIG. 19 is a block diagram showing essential parts of the synchronous DRAM of FIG. 17.

As described above, in the semiconductor integrated circuit according to the present embodiment, a first power supply circuit 91 for a DLL circuit (output timing controller 122) and a second power supply circuit 92 for peripheral circuits are independently provided. Therefore, when the peripheral circuits use a large power of the second power supply circuit 91, an power supply voltage generated by the first power supply circuit 91 is not lowered or fluctuated and is stably applied to the DLL circuit without receiving the influence of the power supply voltage generated by the second power supply circuit 92. Further, when noise is included in an output voltage of the second power supply circuit 92, the DLL circuit (output timing controller 122) receives another output voltage of the first power supply circuit 91 without receiving the influences of the noise, so that the DLL circuit can generate an internal clock which is stable and accurately synchronized with an external clock without including jitter. This configuration of the first and second power supply circuits 91 and 92 is also shown in FIG. 19.

FIG. 18 shows a read operation of the SDRAM of FIG. 17.

The external clock signal CLK is supplied from a system to the SDRAM. In synchronization with a rise of the clock signal CLK, the SDRAM reads commands, address signals, and input data and provides output data.

When reading data out of the SDRAM, the command signals /CS, /RAS, /CAS, and /WE are combined to form an active command (ACT), which is supplied to a command terminal. At the same time, a row address signal is supplied to an address terminal. Then, the SDRAM is activated to select a word line corresponding to the row address, provides corresponding cell data to a corresponding bit line, and amplifies the data by a sense amplifier.

After an operation time tRCD related to the row address, a read command and a column address are supplied to the SDRAM. The SDRAM selects sense amplifier data according to the column address, supplies the data to a data bus line, amplifies the data by a data bus amplifier, further amplifies the data by the output buffer, and transfers the data to the output terminal DQ. These operations are the same as those of a standard DRAM. In the SDRAM, circuits related to a column address carry out a pipeline operation, and read data is continuously provided. Accordingly, a data transfer speed is determined by the period of the external clock signal.

The SDRAM involves three kinds of access time each of which is defined according to a rise of the clock signal CLK. In FIG. 18, there are row address access time tRAC, column address access time tCAC, and clock signal access time tAC. When the SDRAM is used in a high-speed memory system, tRAC and tCAC are important because they determine a period between command input and first data output. The clock signal access time tAC is also important.

FIG. 19 is a block diagram showing essential parts of the SDRAM of FIG. 17 and explains a pipeline operation thereof with, for example, three pipes.

The circuit for processing a column address in the SDRAM is divided into several sections along a processing flow. Each of the divided sections is called a pipe.

As explained with reference to FIG. 17, the buffer 101 has the internal clock generator 121 and output timing controller 122. The internal clock generator 121 generates an ordinary internal clock signal, which is supplied to the pipes 1 and 2. The output timing controller 122 provides a delay-locked (phase-locked) internal clock signal to the output circuit 51 of the pipe 3.

The supplied internal clock signals control the corresponding pipes. Between the pipes, there is a switch for controlling the transmission timing of a signal between the pipes. These switches are controlled according to the internal clock signal generated by the generator 121.

In the pipe 1, a column address buffer 116 amplifies an address signal and sends it to a column decoder 118. The column decoder 118 selects an address. Data at the address is amplified by a sense amplifier 117 and then is supplied to a data bus. The data on the data bus is amplified by a data bus amplifier 119. The pipe 2 involves only a data bus controller 120. The pipe 3 involves the I/O buffer 104 (output circuit 51). The data input buffer 13 in the I/O buffer 104 is not shown in FIG. 19.

The circuit in each pipe completes its operation within a clock cycle, and the switch between the pipes is opened and closed in synchronization with the clock signal, to relay data. As a result, the pipes process data in parallel, and data is continuously sent to the output terminal in synchronization with the clock signal.

Figure 20:
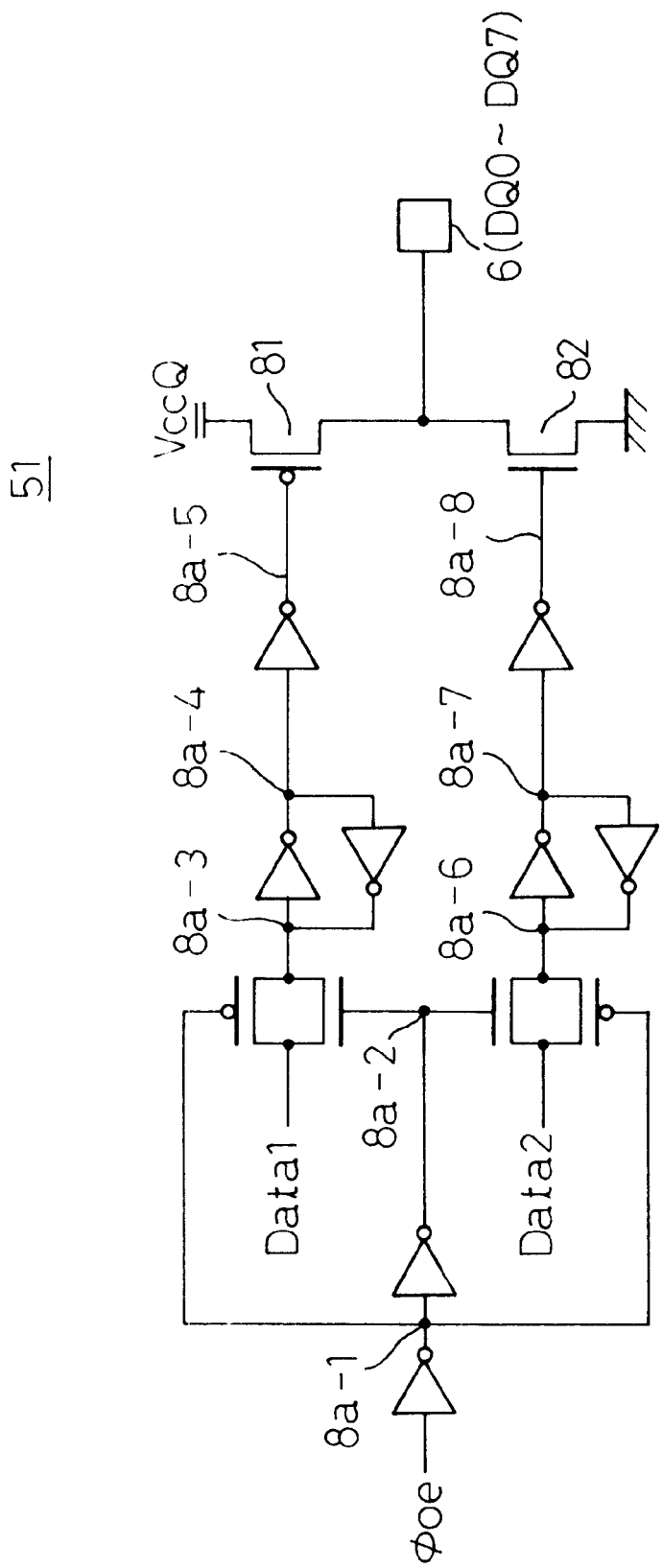
FIG. 20 is a circuit diagram showing an example of a data output buffer of a semiconductor integrated circuit according to the present invention.

FIG. 20 shows an example of the output circuit 51 (output buffer) of FIG. 19. Signals Data1 and Data2 correspond to data read out of a cell array 115 through the sense amplifier 117, data bus amplifier 119, and data bus controller 120 of FIG. 19. The signals Data1 and Data2 are each low when the read data is high and are each high when the read data is low. If the read data is not high nor low under a high-impedance (high-Z) state, the data bus controller 120 sets the signal Data1 to high and the signal Data2 to low. A signal φoe corresponds to the internal clock signal from the output timing controller 122 (corresponding to the delay circuit 33 of FIG. 2) and serves as an enable signal for the output circuit 51.

When the clock signal φoe becomes high, the signals Data1 and Data2 appear at the data output pad 6 (output pads DQ0 to DQ7). When letting the output pad 6 provide a signal of high level, the signal φoe changes from low to high, a node 8a-1 to low, and a node 8a-2 to high, to turn on the transfer gates. Then, the signals Data1 and Data2 are transferred to nodes 8a-3 and 8a-6. As a result, a node 8a-5 changes to low and a node 8a-8 to high, to turn on a p-channel transistor 81 and off an n-channel transistor 82. Consequently, the data output pad 6 provides a signal of high level. When the signal φoe changes to low, the transfer gates are turned off to hold the current output state.

FIG. 21 shows an example of the dummy line 42 (DL) according to the present invention. As shown in FIG. 21, the dummy line DL is formed on a chip and has the same width as the real line 41 (RL). Note that dummy line DL is formed between the dummy delay circuit 34 and the dummy output circuit 52, as shown in FIG. 2. Any dummy line may be replaced with a combination of capacitors or resistors.

The present invention is applicable not only to SDRAMs but also to any semiconductor integrated circuits. A pulse signal generated by a semiconductor integrated circuit according to the present invention can be used not only as a control signal but also as any other signal.

As explained above in detail, in a semiconductor integrated circuit according to the present invention, a DLL circuit receives a power supply voltage from a special power supply circuit (first power supply circuit), and peripheral circuits except for the DLL circuit receive a power supply voltage from another power supply circuit (second power supply circuit). Therefore, when the peripheral circuits use a large power of the second power supply circuit, an power supply voltage generated by the first power supply circuit is not lowered or fluctuated and is stably applied to the DLL circuit without receiving the influence of the power supply voltage generated by the second power supply circuit. Further, when a noise is included in an output voltage of the second power supply circuit, the DLL circuit receives another output voltage of the first power supply circuit without receiving the influence of the noise, so that the DLL circuit can generate an internal clock which is stable and accurately synchronized with an external clock without including jitter.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor integrated circuit having a plurality of elements including a DLL circuit, said DLL circuit receiving a first control signal and generating a second control signal synchronized with the first control signal by carrying out a phase synchronization process, said semiconductor integrated circuit comprising:

a power supply circuit keeping a power supply voltage at a specific voltage level and supplying the power supply voltage only to said DLL circuit, wherein said DLL circuit comprises a first delay circuit receiving the first control signal and supplying the second control signal having a specific delay to an object circuit;

a divider circuit receiving the first control signal;

a second delay circuit receiving a first output signal of said divider circuit;

a phase comparator having a first input to which a second output signal of said divider circuit is supplied, and a second input to which an output signal of said second delay circuit is supplied through a delay applying unit, said phase comparator carrying out a comparing process of comparing phases of the second output signal of said divider circuit and the output signal of said second delay circuit, said delay applying unit applying a delay corresponding to a time determined by transferring an output signal of said first delay circuit from said first delay circuit to said object circuit; and a delay controller receiving an output signal of said phase comparator and controlling delay values of said first and second delay circuits.

2. A semiconductor integrated circuit as claimed in claim 1, wherein said power supply circuit is a voltage down generator.

3. A semiconductor integrated circuit as claimed in claim 2, wherein said voltage down generator comprises a transistor having a first electrode to which the power supply voltage of said semiconductor integrated circuit is applied, a control electrode to which a control voltage is applied, and a second electrode through which an output voltage of said voltage down generator is applied to said DLL circuit.

4. A semiconductor integrated circuit as claimed in claim 3, wherein said voltage down generator further comprises a capacitor for maintaining the control voltage applied to the gate of said transistor.

5. A semiconductor integrated circuit as claimed in claim 1, wherein said divider circuit generates the first and second output signals by X-dividing a frequency of the first control signal, and the comparing process of said phase comparator is carried out by every X periods of the first control signal, where X denotes an integer number of two or more.

6. A semiconductor integrated circuit as claimed in claim 5, wherein the first and second output signals of said divider circuit are complementary signals.

7. A semiconductor integrated circuit as claimed in claim 5, wherein said divider circuit generates the first signal where Y periods of the first control signal is at a first level and Z periods of the first control signal is at a second level, and the comparing process of said phase comparator is carried out at a timing of delaying Y periods of the first control signal, where Y denotes an integer number of two or more, and Z denotes an integer number.

8. A semiconductor integrated circuit as claimed in claim 5, wherein the first control signal is supplied through an input circuit, and the output signal of said second delay circuit is supplied to the second input of said phase comparator through a dummy line, a dummy object circuit, and a dummy input circuit.

9. A semiconductor integrated circuit as claimed in claim 8, wherein a sum of a delay of said input circuit, a minimum delay of said first delay circuit, a delay of said dummy line, and a delay of said object circuit exceeds one period of the first control signal, the comparing process of said phase comparator is carried out by a timing of delaying two or more periods of the first control signal.

10. A semiconductor integrated circuit as claimed in claim 1, wherein said semiconductor integrated circuit is a synchronous DRAM, and the object circuit is an output circuit of said synchronous DRAM.

11. A semiconductor integrated circuit comprising:

a DLL circuit receiving a first control signal and generating a second control signal synchronized with the first control signal by carrying out a phase synchronization process;

a first power supply circuit keeping a first power supply voltage at a specific voltage level and supplying the first power supply voltage to said DLL circuit;

peripheral circuits associated with said DLL circuit; and a second power supply circuit supplying a second power supply voltage to said peripheral circuits, wherein said DLL circuit comprises a first delay circuit receiving the first control signal and supplying the second control signal having a specific delay to an object circuit, a divider circuit receiving the first control signal, a second delay circuit receiving a first output signal of said divider circuit, a phase comparator having a first input to which a second output signal of said divider circuit is supplied, and a second input to which an output signal of said second delay circuit is supplied through a delay applying unit, said phase comparator carrying out a comparing process of comparing phases of the second output signal of said divider circuit and the output signal of said second delay circuit, said delay applying unit applying a delay corresponding to a time determined by transferring an output signal of said first delay circuit from said first delay circuit to said object circuit, and a delay controller receiving an output signal of said phase comparator and controlling delay values of said first and second delay circuits.

12. A semiconductor integrated circuit as claimed in claim 11, wherein said first power supply circuit is a voltage down generator.

13. A semiconductor integrated circuit as claimed in claim 12, wherein said voltage down generator comprises a transistor having a first electrode to which the power supply voltage of said semiconductor integrated circuit is applied, a control electrode to which a control voltage is applied, and a second electrode through which an output voltage of said voltage down generator is applied to said DLL circuit.

14. A semiconductor integrated circuit as claimed in claim 13, wherein said voltage down generator further comprises a capacitor for maintaining the control voltage applied to the gate of said transistor.

15. A semiconductor integrated circuit as claimed in claim 11, wherein said divider circuit generates the first and second output signals by X-dividing a frequency of the first control signal, and the comparing process of said phase comparator is carried out by every X periods of the first control signal, where X denotes an integer number of two or more.

16. A semiconductor integrated circuit as claimed in claim 15, wherein the first and second output signals of said divider circuit are complementary signals.

17. A semiconductor integrated circuit as claimed in claim 15, wherein said divider circuit generates the first signal where Y periods of the first control signal is at a first level and Z periods of the first control signal is at a second level, and the comparing process of said phase comparator is carried out at a timing of delaying Y periods of the first control signal, where Y denotes an integer number of two or more, and Z denotes an integer number.

18. A semiconductor integrated circuit as claimed in claim 15, wherein the first control signal is supplied through an input circuit, and the output signal of said second delay circuit is supplied to the second input of said phase comparator through a dummy line, a dummy object circuit, and a dummy input circuit.

19. A semiconductor integrated circuit as claimed in claim 18, wherein a sum of a delay of said input circuit, a minimum delay of said first delay circuit, a delay of said dummy line, and a delay of said object circuit exceeds one period of the first control signal, the comparing process of said phase comparator is carried out by a timing of delaying two or more periods of the first control signal.

20. A semiconductor integrated circuit as claimed in claim 11, wherein said semiconductor integrated circuit is a synchronous DRAM, and the object circuit is an output circuit of said synchronous DRAM.

21. A semiconductor integrated circuit comprising:

a DLL circuit including a first delay circuit receiving a first control signal and supplying a second control signal having a delay time to the first control signal, a second delay circuit coupling to receive the first control signal, a phase comparator having a first input, coupling to receive the first control signal, and a second input coupling to receive an output signal of said second delay circuit, said phase comparator comparing phases of the first control signal and the output signal of said second delay circuit, and a delay controller receiving an output signal of said phase comparator and controlling delay values of said first and second delay circuits; and a power supply circuit keeping a power supply voltage at a specific voltage level and supplying the power supply voltage exclusively to said DLL circuit.

22. A semiconductor integrated circuit comprising:

an input buffer circuit receiving an external control signal to supply a first control signal;

a DLL circuit receiving the first control signal and generating a second control signal synchronized with the first control signal;

a first power supply circuit keeping a first power supply voltage at a specific voltage level and supplying the first power supply voltage exclusively to said DLL circuit; and a second power supply circuit supplying a second power supply voltage to said input buffer circuit, wherein said DLL circuit comprises a first delay circuit receiving the first control signal and supplying the second control signal having a delay time to the first control signal, a second delay circuit coupling to receive the first control signal, a phase comparator having a first input, coupling to receive the first control signal, and a second input, coupling to receive an output signal of said second delay circuit, said phase comparator comparing phases of the first control signal and the output signal of said second delay circuit, and a delay controller receiving a output signal of said phase comparator and controlling delay values of said first and second delay circuits.

* * * * *